United States Patent
Isobe

(10) Patent No.: US 8,115,278 B2
(45) Date of Patent: Feb. 14, 2012

(54) MANUFACTURING METHOD OF SEMICONDUCTOR DEVICE, EVALUATION METHOD OF SEMICONDUCTOR DEVICE, AND SEMICONDUCTOR DEVICE

(75) Inventor: Atsuo Isobe, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/477,968

(22) Filed: Jun. 4, 2009

(65) Prior Publication Data

US 2009/0250758 A1 Oct. 8, 2009

Related U.S. Application Data

(63) Continuation of application No. 11/420,329, filed on May 25, 2006, now Pat. No. 7,550,382.

(30) Foreign Application Priority Data

May 31, 2005 (JP) ................................. 2005-158733

(51) Int. Cl.
  *H01L 29/00* (2006.01)

(52) U.S. Cl. ................ 257/536; 257/350; 257/E27.113; 257/E27.112

(58) Field of Classification Search .................. 257/536, 257/48, E21.522, E21.531, E21.524, E21.523, 257/E27.025, E27.112, E21.113, 350
See application file for complete search history.

(56) References Cited

U.S. PATENT DOCUMENTS

| | | | |
|---|---|---|---|
| 5,576,556 A | 11/1996 | Takemura | |
| 5,962,897 A | 10/1999 | Takemura | |
| 6,278,131 B1 * | 8/2001 | Yamazaki et al. | ............. 257/59 |
| 6,455,875 B2 | 9/2002 | Takemura | |
| 6,472,684 B1 | 10/2002 | Yamazaki et al. | |
| 6,559,010 B1 | 5/2003 | Kuo | |
| 6,586,802 B2 | 7/2003 | Miyamoto et al. | |
| 6,667,188 B2 | 12/2003 | Tanabe | |
| 6,674,136 B1 | 1/2004 | Ohtani | |
| 6,700,133 B1 | 3/2004 | Ohtani et al. | |
| 6,780,687 B2 | 8/2004 | Nakajima et al. | |
| 6,790,749 B2 | 9/2004 | Takemura | |

(Continued)

FOREIGN PATENT DOCUMENTS

JP 10-098199 4/1998

OTHER PUBLICATIONS

First Office Action issued Jan. 9, 2009 in Chinese Patent Application No. 200610088623.4 with English translation (19 pages).

*Primary Examiner* — Caridad Everhart
(74) *Attorney, Agent, or Firm* — Fish & Richardson P.C.

(57) ABSTRACT

A semiconductor element formed over the same substrate as a TFT, includes a semiconductor film having an impurity region; an insulating film formed over the semiconductor film; an electrode divided into a plurality of parts over the insulating film by spacing a distance a in a first direction (channel width direction); an insulator with a width b formed to be in contact with a side wall of the electrodes and an insulator formed in a region between the electrodes divided into a plurality of parts; a silicide layer formed over part of the surface of the impurity region; and characteristics of the TFT are evaluated by measuring resistance of the semiconductor film of the semiconductor element.

18 Claims, 20 Drawing Sheets

U.S. PATENT DOCUMENTS

| | | |
|---|---|---|
| 6,872,642 B2 * | 3/2005 | Oda et al. .................. 438/528 |
| 6,879,002 B2 | 4/2005 | Miyamoto et al. |
| 6,887,724 B2 | 5/2005 | Nakamura |
| 6,911,358 B2 | 6/2005 | Azami |
| 7,550,382 B2 * | 6/2009 | Isobe ........................ 438/666 |
| 7,709,895 B2 | 5/2010 | Yamazaki et al. |
| 2001/0009222 A1 | 7/2001 | Mizouchi |
| 2001/0015441 A1 | 8/2001 | Kawasaki et al. |
| 2001/0019129 A1 | 9/2001 | You |
| 2001/0020987 A1 | 9/2001 | Ahn |
| 2002/0008801 A1 | 1/2002 | Fukada et al. |
| 2004/0063258 A1 | 4/2004 | Kasahara et al. |
| 2004/0072411 A1 | 4/2004 | Azami et al. |
| 2004/0101989 A1 | 5/2004 | Honda |
| 2005/0017239 A1 | 1/2005 | Nakamura |
| 2005/0037549 A1 | 2/2005 | Takemura |
| 2005/0152658 A1 | 7/2005 | Keyser |
| 2005/0196883 A1 | 9/2005 | Asano |
| 2005/0253178 A1 | 11/2005 | Yamaguchi |
| 2005/0273290 A1 | 12/2005 | Asano |
| 2007/0010057 A1 | 1/2007 | Tang |

* cited by examiner

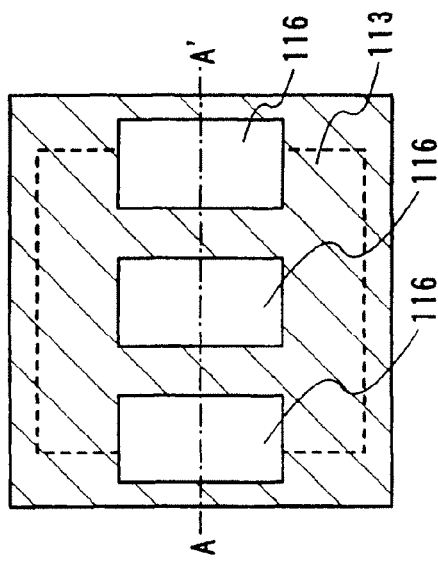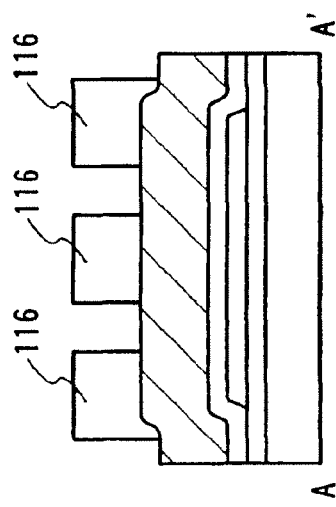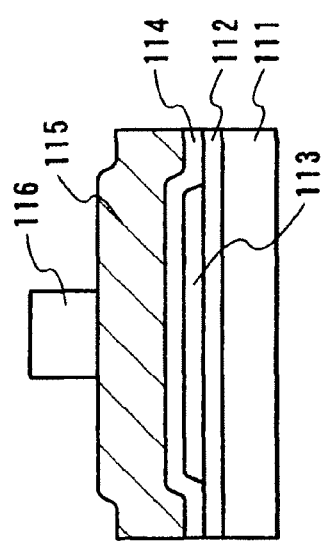

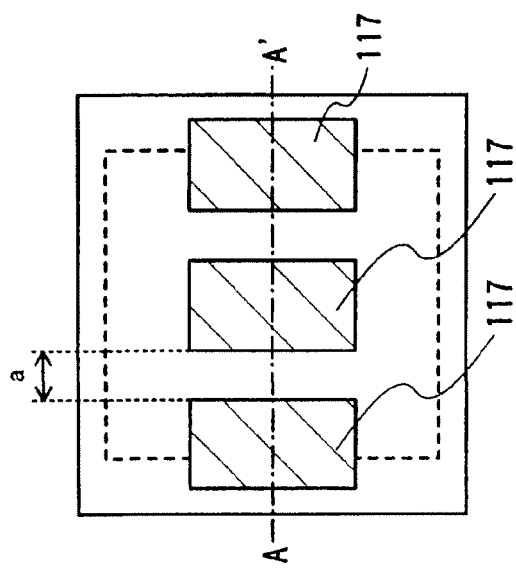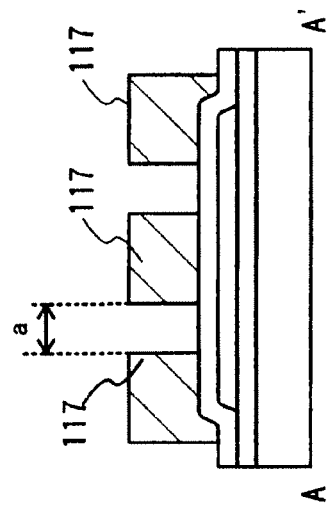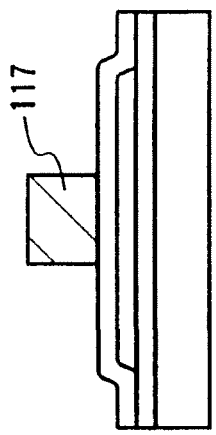

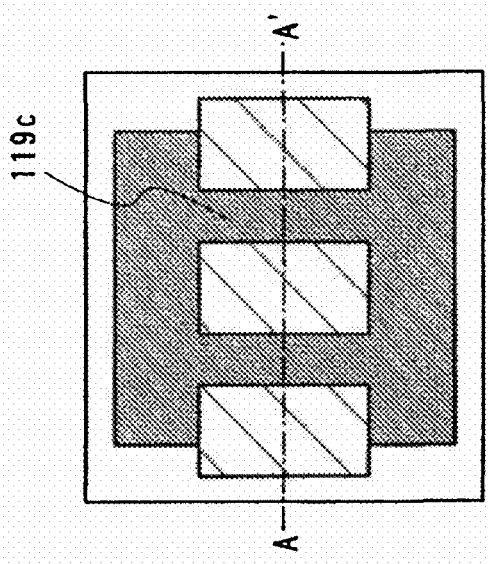
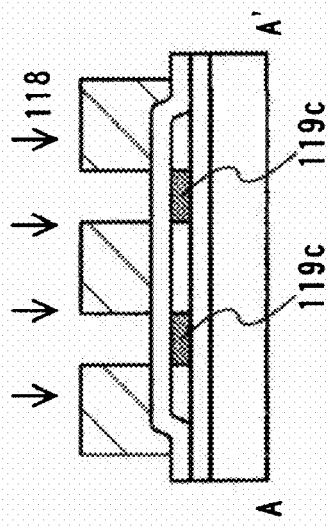
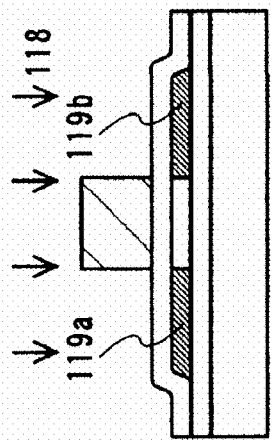

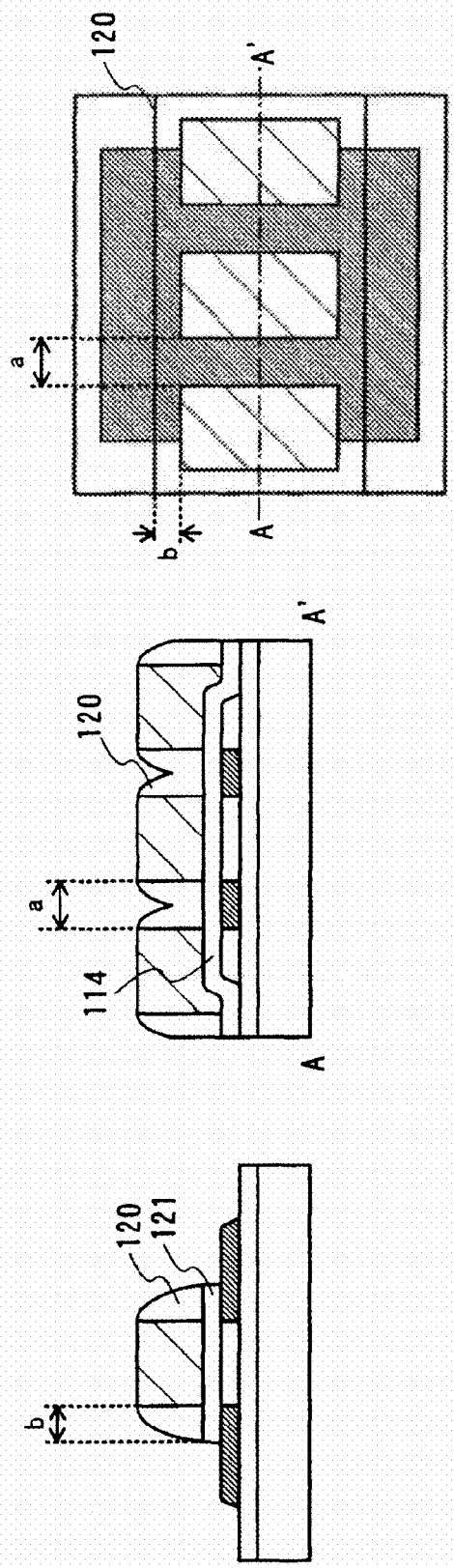

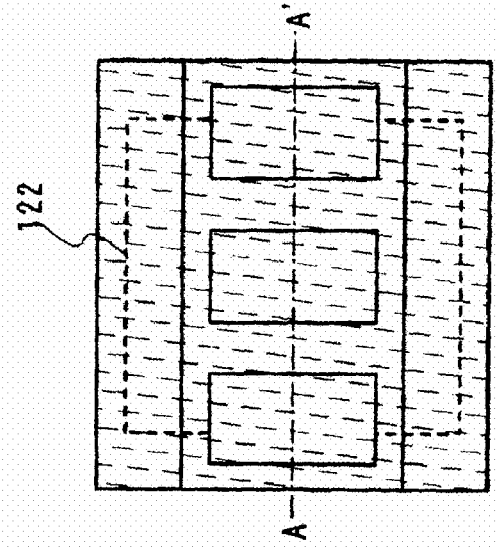
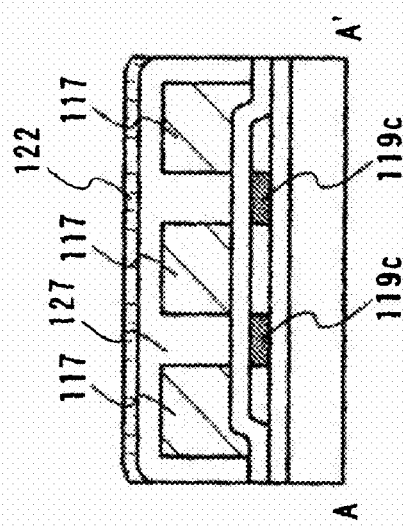
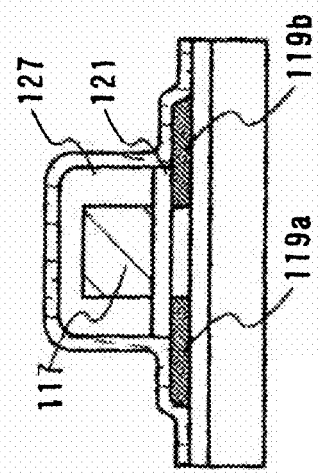

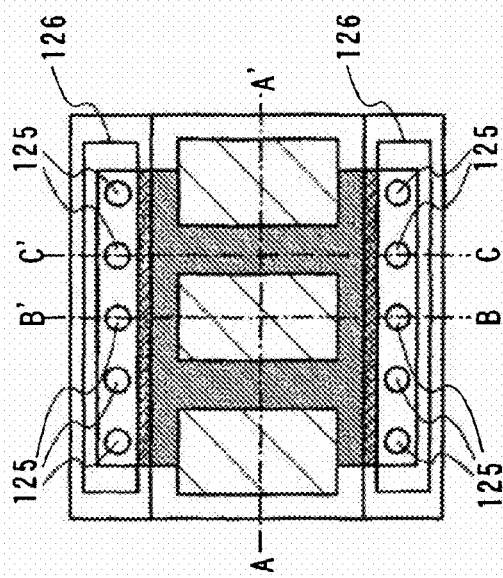
FIG.11C
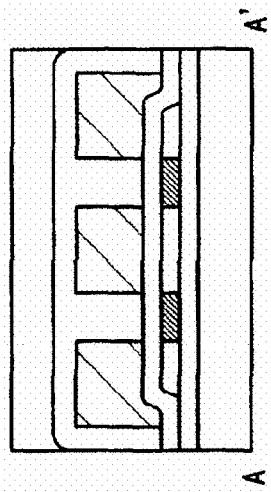
FIG.11A  FIG.11B
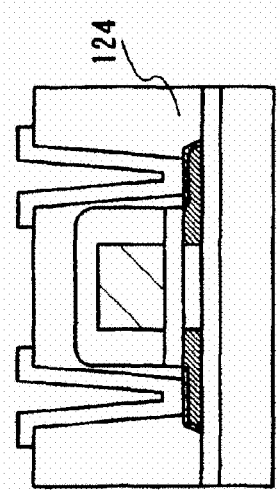
FIG.11D
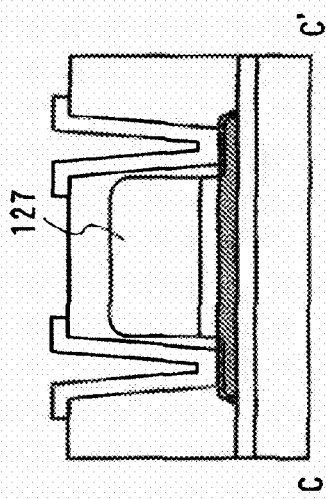
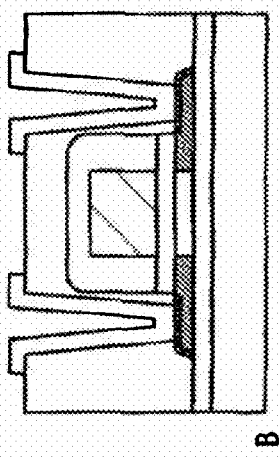
FIG.11E

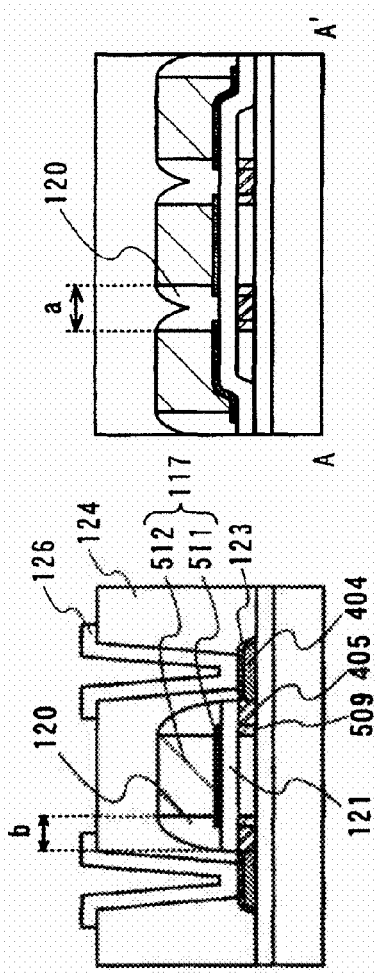
FIG.15A
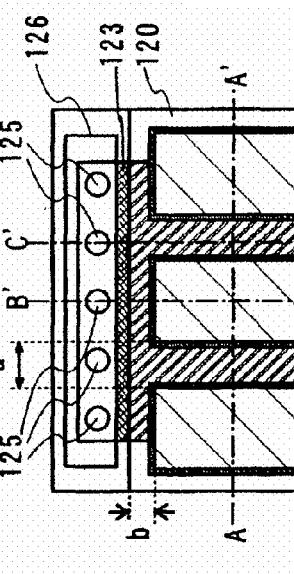
FIG.15B
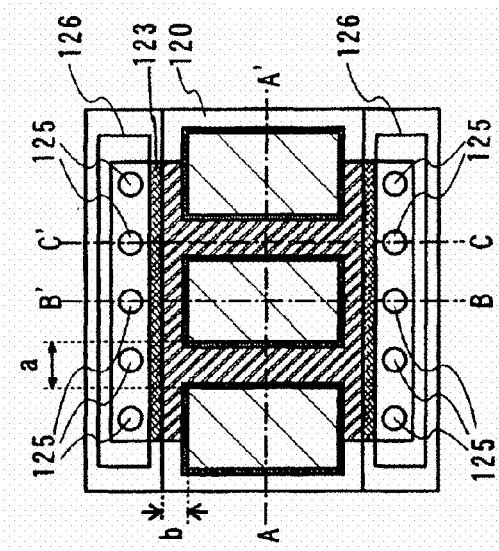
FIG.15C
FIG.15D
FIG.15E

MANUFACTURING METHOD OF SEMICONDUCTOR DEVICE, EVALUATION METHOD OF SEMICONDUCTOR DEVICE, AND SEMICONDUCTOR DEVICE

CROSS-REFERENCE TO RELATED APPLICATIONS

This application is a continuation of U.S. application Ser. No. 11/420,329, filed May 25, 2006, now allowed, which claims the benefit of a foreign priority application filed in Japan as Serial No. 2005-158733 on May 31, 2005, both of which are incorporated by reference.

BACKGROUND OF THE INVENTION

1. Field of the Invention

The present invention relates to an element for evaluation (hereinafter, referred to as TEG (Test Element Group)) for evaluating characteristics of a thin film transistor (Thin Film Transistor: hereinafter, referred to as TFT). In addition, the present invention relates to a manufacturing method of the TEG, an evaluation method of electronic characteristics in a semiconductor device using the TEG, and a semiconductor device that is evaluated using the TEG.

2. Description of the Related Art

Since a conventional thin film transistor (TFT) is formed of an amorphous semiconductor film, it is almost impossible to obtain a TFT having field effect mobility of 10 $cm^2/V \cdot sec$ or more. However, a TFT having high field effect mobility can be obtained owing to the appearance of a TFT formed of a crystalline semiconductor film.

Since the TFT formed of a crystalline semiconductor films has high field effect mobility, various functional circuits can be formed over the same substrate simultaneously by using the TFT. For example, in a display device, previously, a driver IC and the like are mounted on a display portion to have a driver circuit. On the other hand, the use of the TFTs formed of crystalline semiconductor films enables a display portion and a driver circuit formed of a shift register circuit, a level shifter circuit, a buffer circuit, a sampling circuit, and the like to be disposed over the same substrate. The driver circuit is basically formed by a CMOS circuit including an N-channel TFT and a P-channel TFT. In order to obtain high on current drive capacity in the driver circuit, it is necessary to secure a sufficiently large on current.

There is a method for reducing parasitic resistance of a TFT as a method for improving on characteristics. Specifically, parasitic resistance is reduced by providing metal silicide in source and drain regions (see Reference 1: Japanese Patent Application Laid-Open No. H10-98199).

In the case where metal silicide is formed in the source and drain regions, the metal silicide is formed over a surface of an impurity region of silicon (Si) and a contact region of the metal silicide and Si is formed. At this time, when the impurity region of Si has high resistance, the contact region of the metal silicide and Si becomes Shottky junction. When the Schottky junction is formed, contact resistance is increased; thus, on characteristics of a TFT are decreased. In order to improve the on characteristics, it is necessary to reduce the resistance of Si and to form the contact region of the metal silicide and Si to have ohmic contact.

In addition, there is a case where Si is used as a resistor in various circuits. However, when metal silicide is formed, metal silicide is formed over the entire surface of Si; thus, the resistance gets too low. Therefore, there has been a problem that a circuit area is increased when metal silicide of Si is used as the resistor.

There is also a method for removing metal or metal silicide over Si of a region where Si is used as the resistor; however, this method has a problem that the number of steps increases.

At present, a research on a submicron TFT has been carried out actively. However, with the use of a metal silicide method, it has been difficult to measure the resistance of an impurity region of Si when metal silicide is formed in source and drain regions.

Therefore, when on characteristics, which are intended, are not obtained in manufacturing a TFT, it has been difficult to examine whether the cause lies in that the resistance of Si is high or the cause lies in another aspect besides adequately low resistance of Si.

After manufacturing a TFT, as long as the resistance of Si can be measured, it is possible to estimate whether contact between metal silicide and Si has ohmic junction according to resistance of Si. When a TFT has extraordinary characteristics, it is possible to carry out feedback to a process immediately as long as it can be confirmed that the characteristics are beyond or under a standard value.

SUMMARY OF THE INVENTION

As described above, it is an object of the present invention to measure the resistance of an impurity region of Si in a substrate having a TFT where metal silicide is formed in source and drain regions. In addition, metal silicide is formed in the impurity region whereas it is another object of the present invention to manufacture a Si region where metal silicide is not formed in a portion of the impurity region without increasing the number of steps. It is another object of the present invention to carry out feedback to steps and to improve yields by measuring the resistance of Si after manufacturing a TFT.

The present inventor has considered a TEG, which measures resistance of Si, in a substrate where metal silicide is formed by changing a structure of the TEG that measures resistance of Si in an usual step of forming a TFT and measuring a certain measurement condition.

According to one feature of the present invention, a semiconductor device, which is formed over the same substrate as that where a TFT is formed, includes a semiconductor film having an impurity region; an insulating film formed over the semiconductor film; a plurality of electrodes (or an electrode divided into a plurality of parts) over a semiconductor film over the insulating film by spacing a distance a in a first direction (channel width direction); an insulator with a width b formed to be in contact with a side wall of the electrodes and an insulator formed in a region between the plurality of the electrodes; a silicide layer formed over a portion of the surface of the impurity region; a wiring connected to the silicide layer; and a wiring connected to the electrodes, in which a region between the electrodes is covered with the insulator, which is a region without the silicide layer.

According to the present invention, whereas metal silicide is formed in an impurity region, it is possible to manufacture a Si region where metal silicide is not formed in part of the impurity region without increasing the number of steps. Then, since it is possible to manufacture a resistive element, in which the impurity region of Si where metal silicide is not formed is used as a resistor, if necessary, it is possible to reduce a circuit area by using the resistive element as the resistor of the circuit.

According to one feature of the present invention, a method for manufacturing a semiconductor device includes the steps of forming an island-shaped semiconductor film; forming a first insulating film in contact with the semiconductor film; forming a conductive film to cover the semiconductor film and the first insulating film; etching the conductive film to form a plurality of electrodes which is overlapped with the semiconductor film with the first insulating film interposing therebetween and the plurality of electrodes (or the electrode divided into a plurality of parts) over the semiconductor film by spacing a distance a in a first direction; forming an impurity region by adding an impurity element into the semiconductor film by using the electrodes as masks; forming a second insulating film to cover the electrodes and the semiconductor film; and performing anisotropic etching to the second insulating film, in which an insulator with a width b is formed on each side face of each of the electrodes and an insulator is formed in a region between the plurality of electrodes in the step of performing anisotropic etching to the second insulating film, and in which the distance a between the electrodes and the width b of the insulator formed on each side face of each of the electrodes satisfy a relation of a<2b.

According to another feature of the present invention, a method for manufacturing a semiconductor device provided with a semiconductor element for evaluation and a thin film transistor, in which both a manufacturing process of the semiconductor element and a manufacturing process of the thin film transistor include the steps of forming a island-shaped semiconductor film; forming a first insulating film in contact with the semiconductor film; forming a conductive film to cover the semiconductor film and the first insulating film; etching the conductive film to form a plurality of electrodes which are overlapped with the semiconductor film with the first insulating film interposing therebetween; forming an impurity region by adding an impurity element into the semiconductor film by using the electrodes as masks; forming a second insulating film to cover the electrodes and the semiconductor film; performing anisotropic etching to the second insulating film to expose a portion of the semiconductor film; and forming by heat treatment a metal silicide layer in the portion where the semiconductor film is exposed after forming a metal film in contact with the portion where the semiconductor film is exposed, in which the plurality of electrodes (or the electrode divided into a plurality of parts) over the semiconductor film by spacing a distance a in a first direction in the step of etching the conductive film in the semiconductor element, in which an insulator with a width b is formed on each side face of the electrode and an insulator is formed in a region between the electrodes divided into a plurality of parts in the step of performing anisotropic etching to the second insulating film, and in which the distance a between the electrodes and the width b of the insulator formed on each side face of each of the electrodes satisfy a relation of a<2b.

According to another feature of the present invention, an evaluation method of a semiconductor device for evaluating characteristics of a thin film transistor based on characteristics of a semiconductor element, in which both a manufacturing process of the semiconductor element and a manufacturing process of the thin film transistor include the steps of forming a island-shaped semiconductor film; forming a first insulating film in contact with the semiconductor film; forming a conductive film to cover the semiconductor film and the first insulating film; etching the conductive film to form an electrode which is overlapped with the semiconductor film with the first insulating film interposing therebetween; forming an impurity region by adding an impurity element into the semiconductor film by using the electrode as a mask; forming a second insulating film to cover the electrode and the semiconductor film; performing anisotropic etching to the second insulating film to expose a portion of the semiconductor film; and forming by heat treatment a metal silicide layer in the portion where the semiconductor film is exposed after forming a metal film in contact with the portion where the semiconductor film is exposed, in which the electrode is divided into a plurality of parts over the semiconductor film by spacing a distance a in a first direction in the step of etching the conductive film in the semiconductor element, in which an insulator with a width b is formed on each side face of the electrode and an insulator is formed in a region between the electrodes divided into a plurality of parts in the step of performing anisotropic etching to the second insulating film, in which the distance a between the electrodes and the width b of the insulator formed on each side face of the electrode satisfy a relation of a<2b, in which voltage that the semiconductor film below the electrode of the semiconductor element becomes non-conductive is applied to the electrode, and resistance of the impurity region is obtained by measuring resistance of the semiconductor film of the semiconductor element, and in which characteristics of the thin film transistor are evaluated based on the resistance of the impurity region.

According to another feature of the present invention, a semiconductor device includes a semiconductor film having an impurity region; an insulating film, which is in contact with the semiconductor film and formed so as to expose part of the impurity region; an electrode which is overlapped with the semiconductor film with the insulating film interposing therebetween and which is divided into a plurality of parts over the semiconductor film by spacing a distance a in a first direction; an insulator with a width b formed on each side face of the electrode and an insulator formed in a region between the electrodes divided into a plurality of parts; and a metal silicide layer formed in a portion where the impurity region is exposed, in which the distance a between the electrodes and the width b of the insulator formed on each side face of the electrode satisfy a relation of a<2b.

According another feature of the present invention, a semiconductor device, provided with a semiconductor element and a thin film transistor, wherein each of the semiconductor element and the thin film transistor includes a semiconductor film having an impurity region; an insulating film, which is in contact with the semiconductor film and formed so as to expose a portion of the impurity region; an electrode which is overlapped with the semiconductor film with the insulating film interposing therebetween; and a metal silicide layer formed in the portion where the impurity region is exposed, in which the electrode is divided into a plurality of parts over the semiconductor film by spacing a distance a in a first direction in the semiconductor element, and an insulator with a width b formed on each side face of the electrode and an insulator formed in a region between the electrodes divided into a plurality of parts, in which the distance a between the electrodes and the width b of the insulator formed on each side face of the electrode satisfy a relation of a<2b.

According to the present invention, it is possible to form a semiconductor element for evaluation having a Si region where metal silicide is not formed in a portion of an impurity region without increasing the number of steps in a manufacturing process of a TFT where metal silicide is formed in an impurity region. Resistance of the impurity region of Si can be measured by measuring with a certain measurement condition with the use of the semiconductor element, a faulty step will be found easily, and feedback to steps will be performed easily.

According to the present invention, whereas metal silicide is formed in an impurity region, it is possible to form a Si region where metal silicide is not formed in part of the impurity region without increasing the number of steps. Therefore, the size of a circuit is easily reduced by using the impurity region of Si where metal silicide is not formed as a resistive element of a circuit.

BRIEF DESCRIPTION OF DRAWINGS

FIGS. 1A to 1C are views each showing Embodiment Mode 1 according to the present invention;

FIGS. 2A to 2C are views each showing Embodiment Mode 1 according to the present invention;

FIGS. 3A to 3C are views each showing Embodiment Mode 1 according to the present invention;

FIGS. 4A to 4C are views each showing Embodiment Mode 1 according to the present invention;

FIGS. 9A to 9C are views each showing Embodiment Mode 1 according to the present invention;

FIGS. 10A to 11E are views each showing Embodiment Mode 1 according to the present invention;

FIGS. 15A to 15E are views each showing Embodiment Mode 4 according to the present invention;

DETAILED DESCRIPTION OF THE INVENTION

Figure 5A:
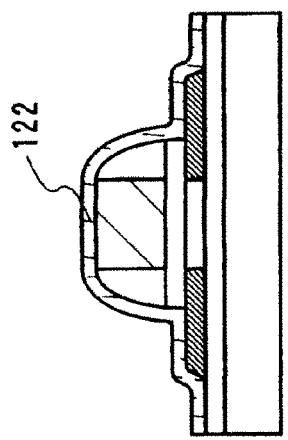
FIGS. 5A to 5C are views each showing Embodiment Mode 1 according to the present invention.

Embodiment Modes of the present invention will be explained below with reference to the accompanying drawings. However, it is to be easily understood that various changes and modifications will be apparent to those skilled in the art. Therefore, unless such changes and modifications depart from the scope of the present invention, they should be construed as being included therein.

In addition, Embodiment Modes 1 to 7 which will be shown below can be arbitrarily combined within the range of enablement.

Embodiment Mode 1

Hereinafter, a structure of a semiconductor element used for a thin film transistor (TFT) and an element for evaluation (TEG), and a manufacturing method thereof will be explained with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A to 7E, FIGS. 8A to 8C, FIGS. 9A to 9C, FIGS. 10A to 10C, FIGS. 11A to 11E, and FIG. 12. In FIGS. A, B, and C in each figures, FIG. A is a cross-sectional view showing a manufacturing process of a TFT, FIG. B is a cross-sectional view showing a manufacturing process of a TEG, and FIG. C is a top view showing a manufacturing process of a TEG. In FIGS. A and B, the cross section has different manner of cutting, that is, whereas FIG. A shows a cross-sectional view of a channel length direction, FIG. B shows a cross-sectional view of a channel width direction (in a case of considering a TEG as a TFT). In other words, whereas FIG. B is a cross-sectional view taken along A-A' in FIG. C, FIG. A is a cross-sectional view in a direction intersecting with A-A' in FIG. C. A TEG used for process evaluation of a semiconductor device in this embodiment mode includes a semiconductor film having an impurity region, an insulating film in contact with the semiconductor film, an electrode that is overlapped with the semiconductor film with the insulating film interposing therebetween and that is divided into a plurality of parts over the semiconductor film by spacing a distance a in a first direction, and an insulator with a width b formed on each side face of the electrode and an insulator formed in a region between the electrodes divided into a plurality of parts, in which the distance a between the electrodes and the width b of the insulator formed on each side face of the electrode satisfy the relation of a<2b.

First, as shown in FIGS. 1A, 1B, and 1C, a base insulating film 112 is formed over a substrate 111 to be 100 to 300 nm thick. As the substrate 111, an insulating substrate such as a glass substrate, a quartz substrate, a plastic substrate, or ceramic; a metal substrate; a semiconductor substrate, or the like can be used.

As the base insulating film 112, a single layer structure of an insulating film containing oxygen or nitrogen such as silicon oxide ($SiO_x$), silicon nitride ($SiN_x$), silicon oxide containing nitrogen ($SiO_xN_y$) (x>y) (also referred to as silicon oxynitride), or silicon nitride containing oxygen ($SiN_xO_y$) (x>y) (also referred to as silicon nitride oxide), or a stacked layer structure thereof can be used. In particular, when contamination from the substrate is concerned, it is preferable to form the base insulating film.

In addition, a surface of the glass substrate may be processed directly by high-density plasma the electron temperature of which is 2 eV or less, the ion energy is 5 eV or less, and the electron density is approximately from $10^{11}$ to $10^{13}/cm^3$, which is excited by a microwave. For generating plasma, a plasma treatment apparatus of microwave excitation using a radial slot antenna can be used. At this time, when nitrogen ($N_2$), or a nitride gas such as ammonia ($NH_3$) or nitrous oxide ($N_2O$) is introduced, the surface of the glass substrate can be nitrided. Since a nitride layer formed over the surface of the glass substrate contains silicon nitride as its main component, the nitride layer can be used as a blocking layer of an impurity diffused from the glass substrate side. A silicon oxide film or a silicon oxynitride film may be formed over the nitride layer by a plasma CVD method so as to be the base insulating film 112.

Besides, by performing the same plasma treatment to a surface of the base insulating film 112 of silicon oxide, silicon oxynitride, or the like, the surface and 1 to 10 nm deep from the surface can be treated for nitriding. By this extremely thin layer of silicon nitride, a blocking layer, which does not have an effect of stress on a semiconductor layer formed thereover, can be made.

Moreover, it is preferable that the base insulating film 112 that is in contact with a semiconductor film be a silicon nitride film or a silicon nitride oxide film having a film thickness of 0.01 to 10 nm, preferably, 1 to 5 nm. In a subsequent crystallization step, when a crystallization method in which a metal element is added into a semiconductor film is used, gettering of the metal element is necessary. In that case, when the base insulating film is a silicon oxide film, in an interface between the silicon oxide film and a silicon film of the semiconductor film, a metal element in the silicon film and oxygen in the silicon oxide film react with each other to be metal oxide, and the metal element may be unlikely to be gettered. Thus, it is preferable that a silicon oxide film be not used for a portion of the base insulating film that is in contact with the semiconductor film. The base insulating film may be formed of a film having a few fixed charges.

Subsequently, a semiconductor film is formed to be 10 to 100 nm thick. A material for the semiconductor film can be selected in accordance with the required characteristics of a TFT, and any of a silicon film, a silicon germanium film, and a silicon carbide film may be used. As the semiconductor film, it is preferable to use a crystalline semiconductor film that is crystallized by a laser crystallization method using an excimer laser or the like after forming an amorphous semiconductor film or a microcrystal semiconductor film. The microcrystal semiconductor film can be obtained by glow discharge decomposition of hydride of silicon such as $SiH_4$. The microcrystal semiconductor film can be easily formed by diluting hydride of silicon with hydrogen or a rare gas element of fluorine.

In addition, it is also possible to apply a rapid thermal annealing (RTA) method using a halogen lamp or a crystallization technique using a heating furnace as the crystallization technique. Further, a method may also be used, in which a metal element such as nickel is added into an amorphous semiconductor film to have solid-phase growth of the added metal as a crystal nucleus.

Then, an island-shaped semiconductor film 113 is formed by patterning the semiconductor film. A first insulating film 114 is formed to be 5 to 50 nm thick so as to cover the island-shaped semiconductor film 113. The first insulating film is in contact with the island-shaped semiconductor film and serves as a gate insulating film.

The first insulating film 114 may have a stacked layer structure by appropriately combining any of silicon oxide ($SiO_x$), silicon nitride ($SiN_x$), silicon oxide containing nitrogen ($SiO_xN_y$) (x>y), silicon nitride containing oxygen ($SiN_xO_y$) (x>y), and the like by a CVD method or a sputtering method. Alternatively, by a radical of low electron temperature with high-density plasma, any of silicon oxide ($SiO_x$), silicon nitride ($SiN_x$), silicon oxide containing nitrogen ($SiO_xN_y$) (x>y), silicon nitride containing oxygen ($SiN_xO_y$) (x>y), and the like may be appropriately combined to have a stacked layer structure. In this embodiment mode, the first insulating film 114 has a stacked layer structure of a $SiN_xO_y$ film and a $SiO_xN_y$ film. In this case, in the same manner as above, oxide or nitriding of a surface of the insulating film may be performed to have a dense film by high-density plasma, the electron temperature of which is 2 eV or less, the ion energy is 5 eV or less, and the electron density is approximately from $10^{11}$ to $10^{13}/cm^3$, which is excited by a microwave. This process may be performed before forming the first insulating film 114. In other words, plasma treatment is performed to a surface of the semiconductor film 113. At this time, a substrate temperature is set to be 300 to 450° C. and processing is performed in an oxidative atmosphere ($O_2$, $N_2O$, or the like) or nitriding atmosphere ($N_2$, $NH_3$, or the like) so that an interface preferable with an insulating film deposited thereover can be formed.

Subsequently, a conductive film 115, which become an electrode, is formed over the first insulating film 114. As the conductive film 115, an aluminum (Al) film, a copper (Cu) film, a film containing aluminum or copper as its main component, a chromium (Cr) film, a tantalum (Ta) film, a tantalum nitride ($TaN_x$) film, a titanium (Ti) film, a tungsten (W) film, a tungsten nitride ($WN_x$) film, a molybdenum (Mo) film, a film stack in which these films are stacked, for example, a staked layer of the Al film and the Ta film, a stacked layer of the Al film and the Ti film, a stacked layer of the TaN film and the W film, or the like can be used. In this embodiment mode, the conductive film 115 is a film stack of tantalum nitride (TaNx) of 30 nm thick and tungsten (W) of 370 nm thick on the tantalum nitride.

Subsequently, a mask 116 is formed over the conductive film 115 by using a photolithography technique with the use of a photomask (FIGS. 1A, 1B, and 1C). The mask 116 has different shapes in a TFT and a TEG. Although the mask 116 of the TFT is not divided over the semiconductor film in a first direction (a direction connecting A-A'), the mask 116 of the TEG is divided into a plurality of parts over the semiconductor film by spacing a distance in the first direction (a direction connecting A-A').

Subsequently, the conductive film 115 is etched using the mask 116 to form an electrode 117 (FIGS. 2A, 2B, and 2C). In this step, the electrodes 117 of the TFT and the TEG are formed to have different shapes. The electrode 117 of the TEG is divided into a plurality of parts over the semiconductor film by spacing a distance a in a first direction (a direction connecting A-A'). On the other hand, the electrode 117 of the TFT is not divided over the semiconductor film in the first direction (a direction connecting A-A').

In this embodiment mode, with the use of the mask 116, tungsten (W), which is the film stack of tantalum nitride (TaNx) of 30 nm thick and tungsten (W) of 370 nm thick, formed for the conductive film 115 is etched. At the first etching, it is preferable to perform etching under an etching condition with high selectivity with respect to tantalum nitride (TaNx) of 30 nm thick. At the first etching, as an etching gas, a mixed gas of $CF_4$, $Cl_2$, and $O_2$ is used, and the mixture ratio is $CF_4/Cl_2/O_2=60/50/45$ sccm. Plasma is generated by supplying a power of 2000 W to a coil-shaped electrode at a pressure of 0.67 Pa. Power of 150 W is applied to a substrate side (sample stage). A temperature of the sample stage is set at −10° C. Note that the mask 116 preferably has a perpendicular shape. When the fist etching is performed, a reaction product of the etching is attached to the side face of the mask 116. The reaction product is dip coated at 60° C. for 10 minutes by using a chemical solution containing oxalic acid as its main component (product name: SPR 301) to remove. Subsequently, dip coating is performed with a peeling solution to remove the mask. Then, tantalum nitride (TaNx) is etched by using tungsten (W) as a mask. The electrode 117 is formed by the second etching. At this time, it is preferable to perform etching under an etching condition with high selectivity with respect to the first insulating film 114 so that the first insulating film 114 is not etched. In addition, as for tungsten (W) too, it is preferable to perform etching under an etching condition with high selectivity with respect to tungsten (W) so that tungsten (W) is not etched. Under the second etching condition, plasma is generated by supplying a power of 1000 W to a coil-shaped electrode at a pressure of 2.00 Pa. A power of 50 W is applied to the substrate side (sample stage). An etching gas is $Cl_2$ and a temperature of the sample stage is set at −10° C.

Through the above steps, the electrode having a perpendicular shape is obtained. The electrode 117 serves as a gate electrode.

The etchings of this embodiment mode can be performed by dry etching, and specifically, an ICP (Inductively Coupled Plasma) etching method can be used.

Next, an impurity element is added into the island-shaped semiconductor film 113. In this embodiment mode, the island-shaped semiconductor film 113 is doped with a high-concentration impurity ion 118 (FIGS. 3A, 3B, and 3C). FIG. 3B shows a cross-sectional view taken along A-A' in FIG. 3C. The island-shaped semiconductor film 113 is doped with a high-concentration impurity element by transmitting the first insulating film to form high-concentration impurity regions 119$a$, 119$b$, and 119$c$. The element concentrations of the high-concentration impurity regions 119$a$, 119$b$, and 119$c$ are each $1\times10^{18}$ to $1\times10^{22}$ atoms/cm$^3$ (preferably, $1\times10^{19}$ to $5\times10^{20}$ atoms/cm$^3$). An ion doping method or an ion implantation method can be used as the doping method. For example, boron (B), gallium (Ga), or the like is used as the impurity element in manufacturing a P-type semiconductor, whereas phosphorus (P), arsenic (As), or the like is used in manufacturing an N-type semiconductor.

Then, a second insulating film is formed so as to cover the first insulating film 114 and the electrode 117. The second insulating film is formed by depositing a silicon oxide containing nitrogen (SiO$_x$N$_y$ film) (x>y) of 100 nm by a plasma CVD method and thereafter a silicon oxide film (SiO$_2$ film) of 200 nm by a thermal CVD method. As the second insulating film, a silicon oxide film (SiO$_x$N$_y$ film) may be formed from TEOS/O$_2$-based material by plasma CVD.

Next, the second insulating film is selectively etched by anisotropic etching by which etching is mainly performed in a perpendicular direction to form an insulator 120 in contact with each side face of the electrode 117 and an insulator 120 in a region between the electrodes divided into a plurality of parts (FIGS. 4A, 4B, and 4C). In this step, the top face of the electrode 117 is exposed. However, the insulating film that is used as a mask may be formed over the electrode 117 in some cases and, in this case, the top face of the electrode 117 may not be exposed in some cases. The insulator formed on each side face of the electrode can be formed to have a width b of 10 to 300 nm. The width b corresponds to the width of the insulator formed on the side face of the electrode other than the region between the electrodes divided into a plurality of parts. The distance a between the electrodes 117 divided into a plurality of parts in the structure shown in FIG. 2B may be shorter than the twice of the width b of the insulator formed on each side face of the electrode. In other words, the distance a between the electrodes divided into a plurality of parts and the width b of the insulator formed on each side face of the electrode may satisfy the relation of a<2b. A region between the electrodes divided into a plurality of parts is still covered with the insulator even after the anisotropic etching step as long as the relation of a<2b is satisfied. Thus, metal silicide will not be formed in the region between the electrodes divided into a plurality of parts in subsequent steps. The insulator 120 formed on each side face of the electrode becomes a sidewall, which will be subsequently used as a mask in forming silicide. In addition, part of the first insulating film is also removed by the etching step to form an insulating film 121, and part of the semiconductor film is exposed. The step of exposing the semiconductor film by removing the first insulating film is performed by using the electrode, the insulator in contact with each side face of the electrode, and the insulator formed in the region between the electrodes divided into a plurality of parts as masks. The portions of the exposed semiconductor film subsequently serve as source and drain regions. The insulating film 121 serves as a gate insulating film. When the etching selectivity of the insulating film and the semiconductor film is low, the exposed semiconductor film is slightly etched to have a thin film thickness.

Note that, thermal activation of the impurity regions may be performed before forming the insulators or after forming the insulators. A method such as laser light irradiation, RTA, or a heat treatment using a furnace can be used as the activation. In addition, since silicide is in contact with wirings in this structure, a step of thermal activation of the impurity regions can also be omitted.

Figure 5B:
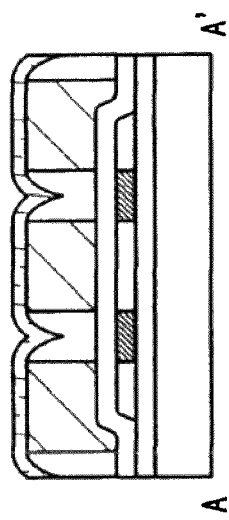
Figure 5C:
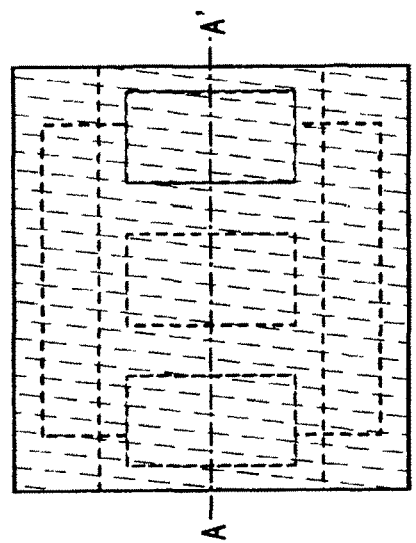

Next, after a natural oxide film formed over the surface of the exposed portion of the semiconductor film is removed, a metal film 122 is formed (FIGS. 5A, 5B, and 5C). The metal film 30 becomes a material which reacts with the semiconductor film to form silicide. As the metal film, for example, a nickel film, a titanium film, a cobalt film, a platinum film, or a film composed of an alloy containing at least two kinds of these elements, or the like can be given. In this embodiment mode, a nickel film is used as the metal film 122, and the nickel film is formed by sputtering at a room temperature by a deposition power of 500 W to 1 kW.

After forming the nickel film, a silicide layer 123 is formed by heat treatment. The silicide layer 123 is nickel silicide here. As the heat treatment, RTA, furnace annealing, or the like can be used. Then, nickel which has not reacted is removed. Here, nickel which has not reacted is removed by using an etching solution composed of HCl:HNO$_3$:H$_2$O=3:2:1. When nickel which has not reacted is removed, the silicide layer 123 remains only in a region where the impurity regions are exposed (FIGS. 6A, 6B, and 6C).

Figure 7C:
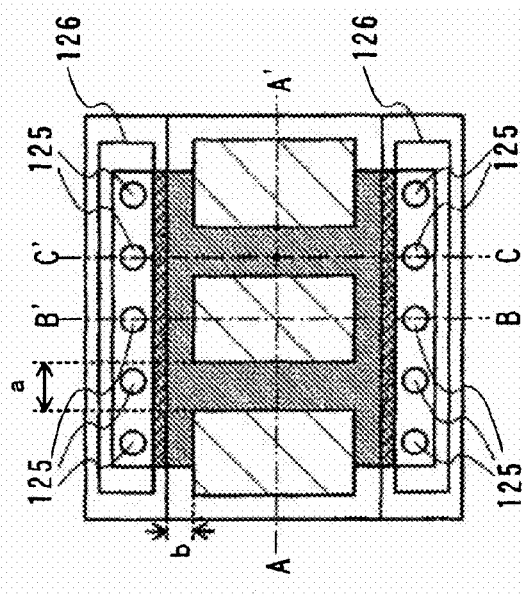
FIGS. 7A to 7E are views each showing Embodiment Mode 1 according to the present invention.
Figure 7B:
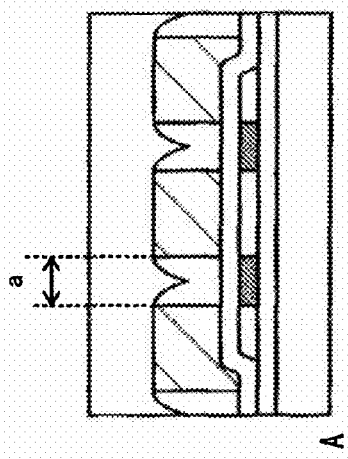
Figure 7A:
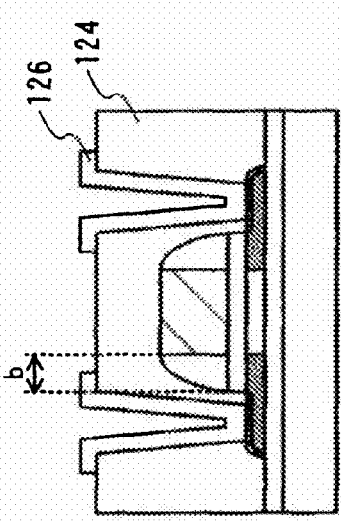
Figure 7E:
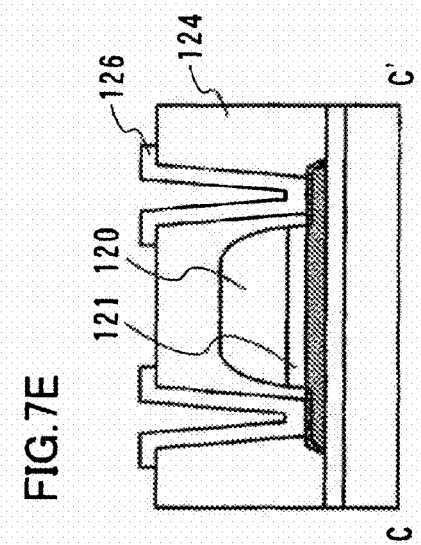
Figure 7D:
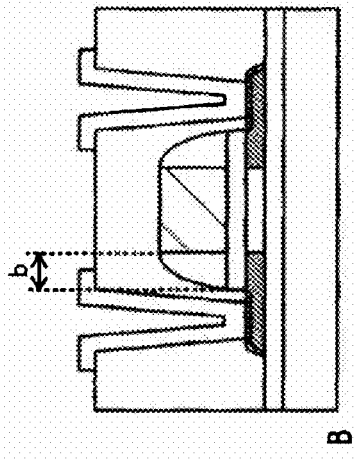

Thereafter, an interlayer insulating film 124 is formed (FIGS. 7A, 7B, and 7C). The interlayer insulating film 124 is formed by using an organic material or an inorganic material. The interlayer insulating film 124 may have a single layer structure or a stacked structure. A contact hole 125 is formed by etching in the interlayer insulating film 124 to expose the silicide layer 123. Then, a conductive layer is formed so that the contact hole is filled and etched to form a wiring 126. FIG. 7B is a cross section taken along A-A' in FIG. 7C. FIG. 7D is a cross section taken along B-B' in FIG. 7C. FIG. 7E is a cross section taken along C-C' in FIG. 7C.

Note that, thermal activation of the impurity regions may be performed before forming the interlayer insulating film or after forming a first layer or a second layer in a case of a stacked interlayer insulating film. A method such as laser light irradiation, RTA, or heat treatment using a furnace can be used as the thermal activation. In addition, since silicide is in contact with wirings in this structure, a step of thermal activation of the impurity regions can also be omitted.

Figure 6C:
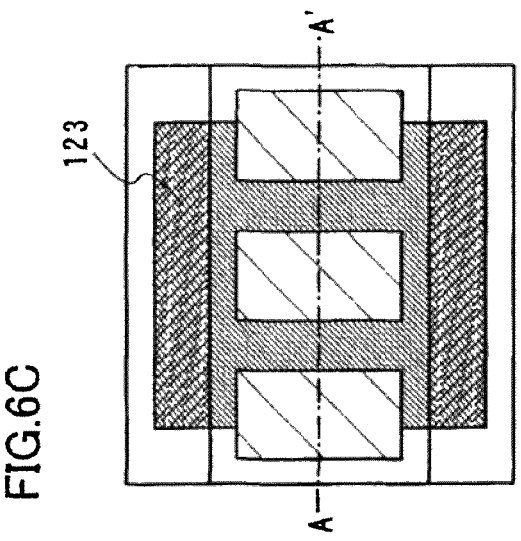
FIGS. 6A to 6C are views each showing Embodiment Mode 1 according to the present invention.
Figure 6B:
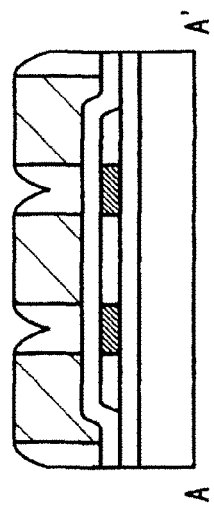
Figure 6A:
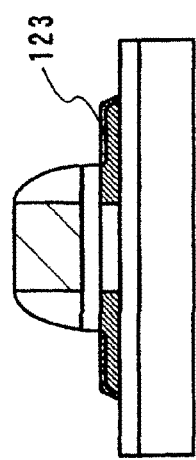

As shown in FIGS. 6A, 6B, and 6C, although silicide is formed in the high-concentration impurity regions 119$a$ and 119$b$, silicide is not formed in the high-concentration impurity region 119$c$ in the region between the electrodes divided into a plurality of parts in the structure of this embodiment mode. It is possible to form regions where silicide is formed and where silicide is not formed without increasing the number of steps in the structure of this embodiment mode.

Figure 8C:
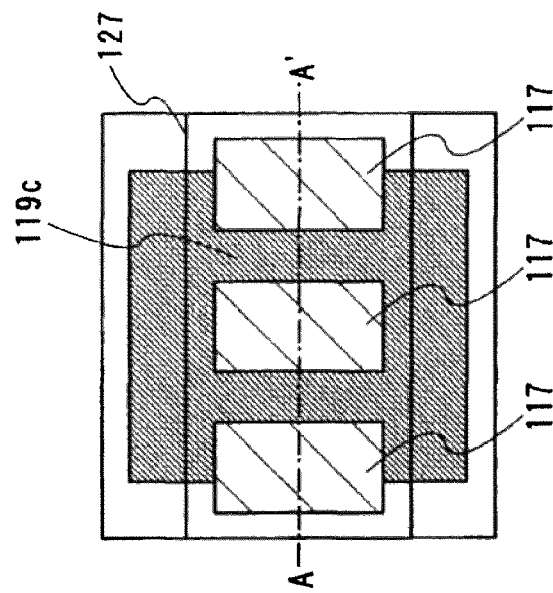
FIGS. 8A to 8C are views each showing Embodiment Mode 1 according to the present invention.
Figure 8B:
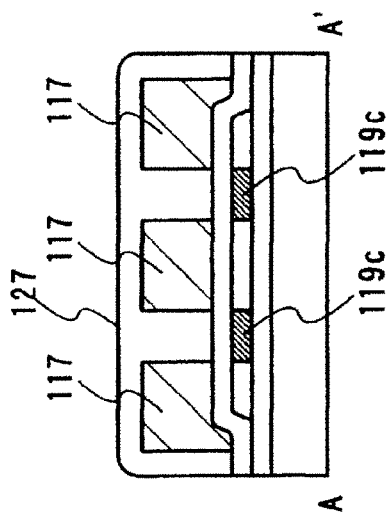
Figure 8A:
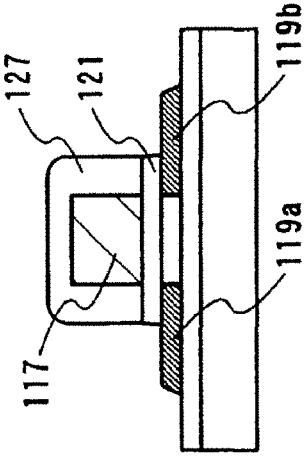
Figure 10C:
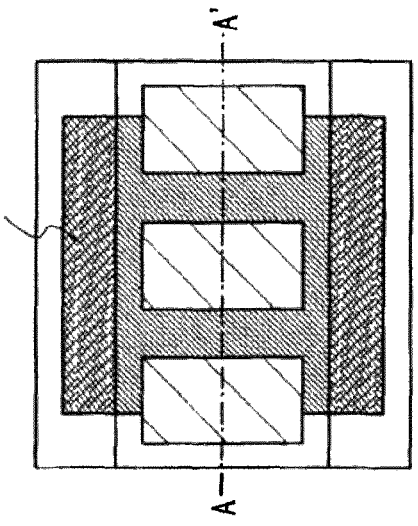
FIGS. 10A to 10C are views each showing Embodiment Mode 1 according to the present invention.
Figure 10B:
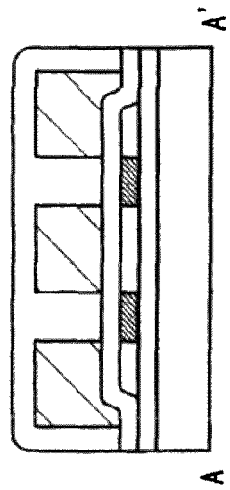
Figure 10A:
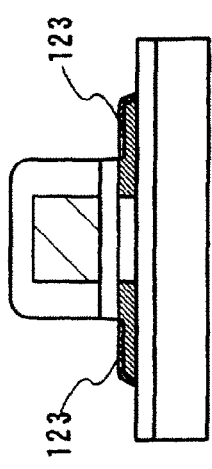

In addition, the metal film 122 is formed after forming the insulator in contact with each side face of the electrode; however, the method is not limited thereto. A mask may be used instead of the insulator in contact with each side face of the electrode, and this method will be explained with reference to FIGS. 8A to 8C, FIGS. 9A to 9C, FIGS. 10A to 10C, and FIGS. 11A to 11E. After the doping of the impurity ion of FIGS. 3A to 3C, a mask 127 is formed so as to cover the region between the electrodes divided into a plurality of parts, as well as the electrode 117 (FIGS. 8A, 8B, and 8C). The mask 127 can be formed using an insulating film such as a silicon oxide film, a resist mask, or the like. Thereafter, part of the first insulating film is removed by etching so that part of the semiconductor film is exposed, and the insulating film 121 is formed. The exposed portion of the semiconductor film will subsequently become a source region and a drain region. The insulating film 121 serves as a gate insulating film.

Next, as shown in FIGS. 9A, 9B, and 9C and FIGS. 10A, 10B, and 10C, the metal film 122 is formed and silicide layer 123 is formed in the exposed portion of the semiconductor film by heat treatment. Then, the metal film which has not reacted is removed. Thereafter, the interlayer insulating film 124 is formed and the wiring 126 is formed to have the structure shown in FIGS. 11A, 11B, and 11C. Although the structure where the mask 127 remains without being removed is shown, the mask 127 may be removed after forming silicide. FIG. 11D is a cross section taken along B-B' in FIG. 11C. FIG. 11E is a cross section taken along C-C' in FIG. 11C.

The method by which the mask is used instead of the insulator formed on each side face of the electrode and formed in the region between the electrodes that is divided by anisotropic etching can be applied not only to this embodiment mode but also to Embodiment Modes 2, 3, and 4 which will be subsequently described.

As described above, in a semiconductor device including a TFT manufactured in this embodiment mode, a TFT where metal silicide is formed in an impurity region and a semiconductor element having an electrode divided into a plurality of parts where metal silicide is not formed in part of an impurity region can be formed over the same substrate without increasing the number of steps.

Figure 12:
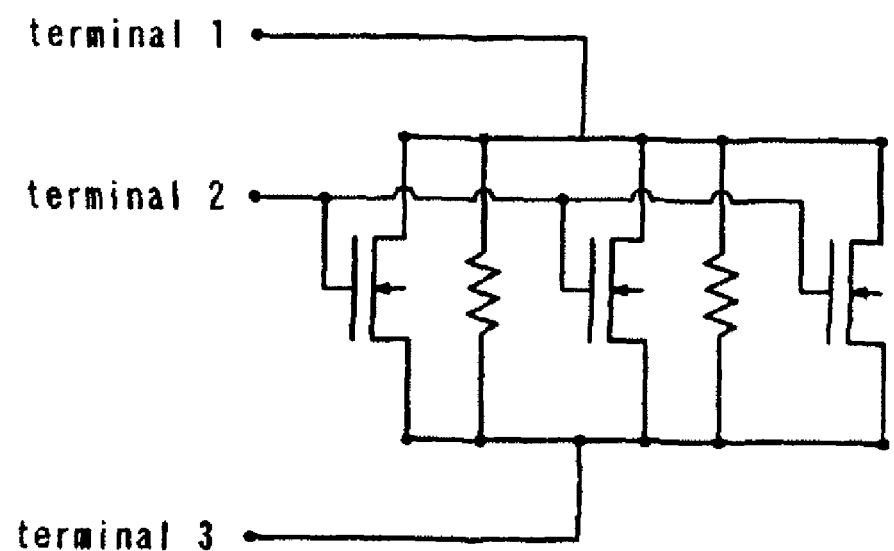
FIG. 12 is a diagram showing Embodiment Mode 1 according to the present invention.

A method for measuring the semiconductor element, which is manufactured in this embodiment mode, having an electrode divided into a plurality of parts where metal silicide is not formed in part of an impurity element will be explained with reference to FIG. 12. In a semiconductor device including a semiconductor element where metal silicide is formed in an impurity region by using the semiconductor element, it becomes possible to measure the resistance of the impurity region. FIG. 12 shows the semiconductor element in an equivalent circuit including TFTs and resistors. A region where the electrode 117 is formed over the semiconductor film (a cross section taken along B-B') in a top view of the semiconductor element shown in FIG. 7C corresponds to TFTs in the equivalent circuit shown in FIG. 12. In addition, a region where the impurity regions (119c) are formed between the electrodes 117 divided into a plurality of parts (a cross section taken along C-C') in the top view of the semiconductor film shown in FIG. 7C corresponds to resistors in the equivalent circuit shown in FIG. 12.

When an N-type high-concentration impurity region is formed using phosphorus (P), arsenic (As), or the like for the impurity ion 118, the TFT of the equivalent circuit shown in FIG. 12 is an N-type TFT. In a case where an N-type TFT is formed, minus voltage is applied so that the N-type TFT becomes non-conductive state (off state) at a terminal 2. When the N-type TFT is in an off state, current does not flow in the TFT portion; thus, only the original resistor can have approximation substantially as an equivalent circuit. Under this condition, the terminal 3 serves as a ground (GND) to fluctuate the voltage of the terminal 1; therefore, the resistance of the equivalent circuit shown in FIG. 12 can be obtained from current-voltage characteristics. In the above condition, the terminal 3 is provided as a ground; however, the voltage relation of the terminals 1, 2, and 3 is relative. Therefore, the present invention is not limited thereto. The voltage of the terminal 2 may be lower than the voltages of the terminals 1 and 3. In addition, when the N-type TFT has a low threshold voltage of a normally-on type or a depletion type, it is preferable to set the voltage of the terminal 2 to be a value smaller than the voltage of the terminals 1 and 3 by Vth+0.3V to Vth+2.0V.

When a P-type high-concentration impurity region is formed using boron (B), gallium (Ga), or the like for the impurity ion 118, the TFT of the equivalent circuit shown in FIG. 12 is a P-type TFT. In a case where a P-type TFT is formed, plus voltage is applied so that the P-type TFT becomes non-conductive state (off state) at the terminal 2. When the P-type TFT is in an off state, current does not flow in the TFT portion; thus, only the original resistor can have approximation substantially as an equivalent circuit. Under this condition, the terminal 3 serves as a ground (GND) to fluctuate the voltage of the terminal 1; therefore, the resistance of the equivalent circuit shown in FIG. 12 can be obtained from current-voltage characteristics. In the above condition, the terminal 3 is provided as a ground; however, the voltage relation of the terminals 1, 2, and 3 is relative. Therefore, the present invention is not limited thereto. The voltage of the terminal 2 may be higher than the voltages of the terminals 1 and 3. In addition, when the P-type TFT has a low threshold voltage of a normally-on type or a depletion type, it is preferable to set the voltage of the terminal 2 to be a value larger than the voltage of the terminals 1 and 3 by Vth+0.3V to Vth+2.0V.

According to this embodiment mode, it is possible to form a semiconductor element for evaluation having a Si region where metal silicide is not formed in part of an impurity region without increasing the number of steps in a manufacturing process of a TFT where metal silicide is formed in an impurity region. Resistance of the impurity region of Si can be measured by measuring with a certain measurement condition with the use of the semiconductor element, a faulty step will be found easily, and feedback to steps will be performed easily.

In this embodiment mode, although a semiconductor element in which three TFTs and two resistors are connected in parallel is shown, the number of TFTs and resistors is not limited thereto. The number of TFTs and resistors can be increased or reduced, if necessary.

Embodiment Mode 2

Figure 13A:
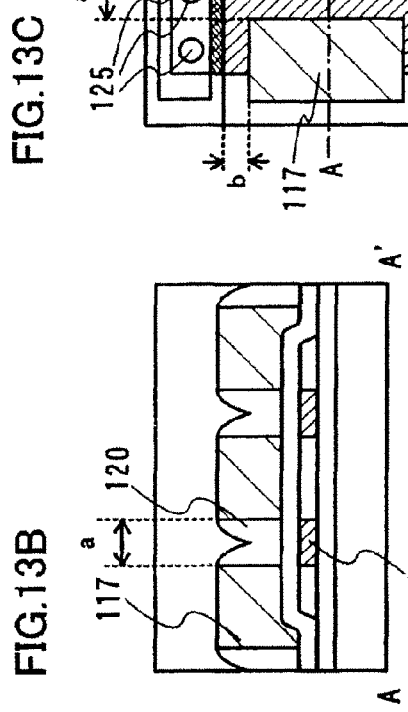
FIGS. 13A to 13E are views each showing Embodiment Mode 2 according to the present invention.
Figure 13B:
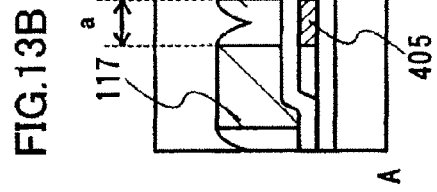
Figure 13C:
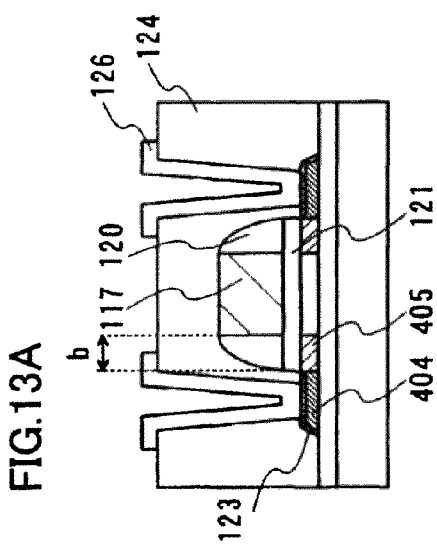
Figure 13D:
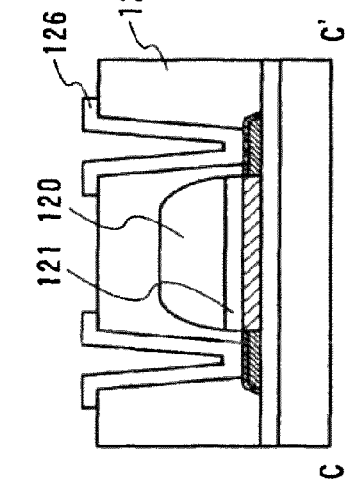
Figure 13E:
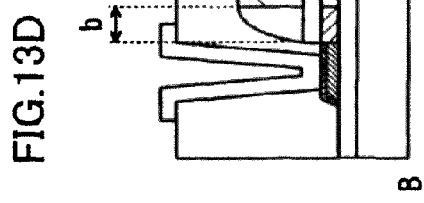

In this embodiment mode, a semiconductor device having a low-concentration impurity region is shown in FIGS. 13A to 13E. In addition, portions identical with Embodiment Mode 1 are denoted by the same reference numerals and detailed explanations thereof will be omitted. FIG. 13A shows a cross-sectional view of a TFT, FIGS. 13B, 13D, and 13E each show a cross-sectional view of a semiconductor element (TEG), and FIG. 13C shows a top view of the semiconductor element. FIG. 13B is a cross section taken along A-A' in FIG. 13C, FIG. 13D is a cross section taken along B-B' in FIG. 13C, and FIG. 13E is a cross section taken along C-C' in FIG. 13C. Note that FIG. 13A corresponds to a cross-sectional view taken along B-B' in a direction intersecting with A-A' in FIG. 13C.

In this embodiment mode, up to FIGS. 2A to 2C, a TFT and a semiconductor element are formed in the same steps as Embodiment Mode 1. Next, a low-concentration impurity ion is doped using an electrode 117 as a mask to form a low-concentration impurity region. The element concentration of the low-concentration impurity region is $1\times10^{16}$ to $1\times10^{20}$ atoms/cm$^3$ (preferably, 1×10$^{17}$ to 5×10$^{19}$ atoms/cm$^3$). An ion doping method or an ion implantation method can be used as the doping method. For example, boron (B), gallium (Ga), or the like is used as the impurity element in manufacturing a P-type semiconductor, whereas phosphorus (P), arsenic (As), or the like is used in manufacturing an N-type semiconductor.

Then, an insulator 120 in contact with each side face of the electrode and an insulator 120 in the region between the electrodes divided into a plurality of parts are formed, and an insulating film 121 is newly formed by etching the first insulating film. At this time, when the etching selectivity of the insulating film and the semiconductor film is low, the semiconductor film that is not covered with the insulators 120 is slightly etched to have a thin film thickness, simultaneously with forming the insulating film 121.

Next, a high-concentration impurity ion is doped using the electrode 117 and the insulators 120 as masks to form a high-concentration impurity region 404. A high-concentration impurity region 405 is formed by doping of the high-concentration impurity ion. The element concentration of the high-concentration impurity region 404 is 1×10$^{19}$ to 1×10$^{21}$ atoms/cm$^3$. An ion doping method or an ion implantation method can be used as the doping method. For example, boron (B), gallium (Ga), or the like is used as the impurity element in manufacturing a P-type semiconductor, whereas phosphorus (P), arsenic (As), or the like is used in manufacturing an N-type semiconductor.

Then, after forming a silicide layer 123, an interlayer insulating film 124 and a wiring 126 are formed to obtain the structure shown in FIGS. 13A to 13E.

Although not shown, a structure of a semiconductor element of this embodiment mode may be formed by forming a mask 127 without forming the insulator 120 in the same manner as Embodiment Mode 1.

Through the above steps, a TFT having the low-concentration impurity region 405 (a Loff region where an electrode is not overlapped with an insulating film interposing therebetween) is completed. A TFT formed in this embodiment mode has the Loff region; therefore, short channel effect to be occurring when the gate length gets shorter can be suppressed.

As described above, in a semiconductor device including a TFT manufactured in this embodiment mode, the TFT having source and drain regions where metal silicide is formed in the high-concentration impurity region, and a Loff region; and the semiconductor element where metal silicide is not formed in the low-concentration impurity region can be formed over the same substrate without increasing the number of steps.

The method for measuring the semiconductor element where metal silicide is not formed in a low-concentration impurity region that is manufactured in this embodiment mode is the same as that explained in Embodiment Mode 1; thus, the explanation is omitted here.

According to this embodiment mode, it is possible to form a semiconductor element for evaluation having a Si region where metal silicide is not formed in part of an impurity region without increasing the number of steps in a manufacturing process of a TFT where metal silicide is formed in an impurity region. Resistance of the impurity region of Si can be measured by measuring with a certain measurement condition with the use of the semiconductor element, a faulty step will be found easily, and feedback to steps will be performed easily.

Embodiment Mode 3

Figure 14C:
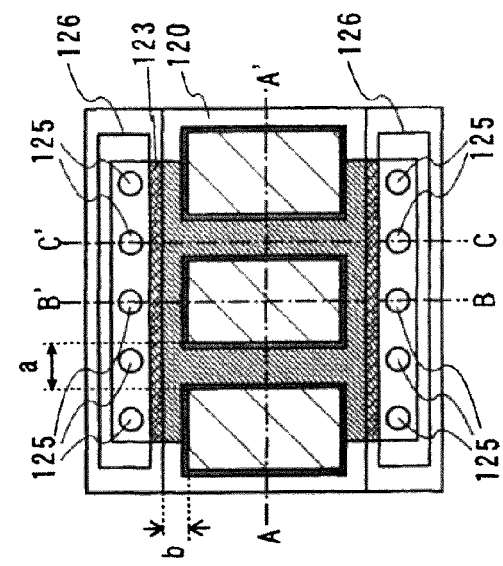
FIGS. 14A to 14E are views each showing Embodiment Mode 3 according to the present invention.
Figure 14B:
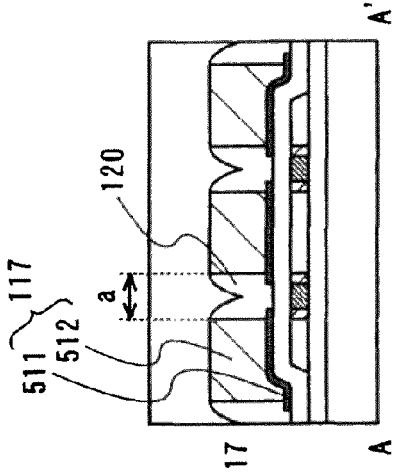
Figure 14A:
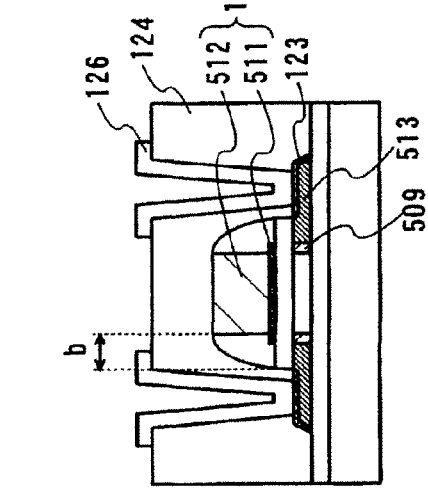
Figure 14E:
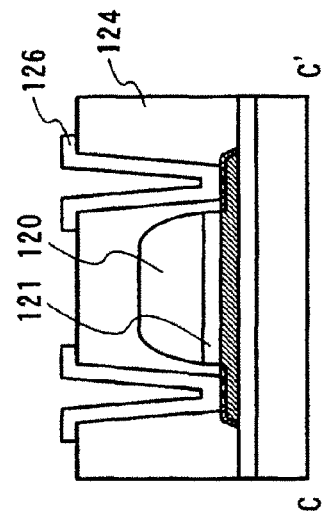
Figure 14D:
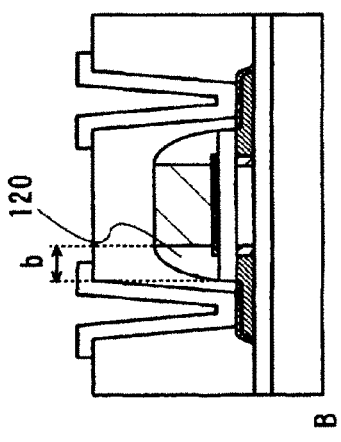

In this embodiment mode, a semiconductor device including a TFT having a low-concentration impurity region disposed to overlap with an electrode with an insulating film interposing therebetween (a Lov region) is shown in FIGS. 14A to 14E. In addition, portions identical with Embodiment Modes 1 and 2 are denoted by the same reference numerals and detailed explanations thereof will be omitted. FIG. 14A shows a cross-sectional view of a TFT, FIGS. 14B, 14D, and 14E each show a cross-sectional view of a semiconductor element (TEG), and FIG. 14C shows a top view of the semiconductor element (TEG). FIG. 14B is a cross section taken along A-A' in FIG. 14C, FIG. 14D is a cross section taken along B-B' in FIG. 14C, and FIG. 14E is a cross section taken along C-C' in FIG. 14C. Note that FIG. 14A corresponds to a cross-sectional view taken along B-B' in a direction intersecting with A-A' in FIG. 14C.

In this embodiment mode, up to steps of forming the first insulating film so as to cover the island-shaped semiconductor film, a TFT and a semiconductor element are formed in the same steps as Embodiment Mode 1. Next, over a first insulating film a second conductive film is formed over a first conductive film to be an electrode are formed. First, the first conductive film is formed to be 5 to 50 nm thick. As the first conductive film, an aluminum (Al) film, a copper (Cu) film, a film containing aluminum or copper as its main component, a chromium (Cr) film, a tantalum (Ta) film, a tantalum nitride (TaN) film, a titanium (Ti) film, a tungsten (W) film, a molybdenum (Mo) film, or the like can be used. The second conductive film is formed thereover to be 150 to 500 mm thick. As the second conductive film, for example, a chromium (Cr) film, a tantalum (Ta) film, a film containing tantalum as its main component, or the like can be used. However, the first conductive film and the second conductive film have to be combined so as to have selectivity in each etching. As the combination of the first conductive film and the second conductive film that can have selectivity, Al and Ta, Al and Ti, or TaN and W can be used, for example. In this embodiment mode, TaN is used for the first conductive film and W is used for the second conductive film.

Subsequently, a resist mask is formed using a photolithography technique, using a photomask over the second conductive film. The mask has different shapes in a TFT and a TEG Although the mask of the TFT is not divided over the semiconductor film in a first direction (a direction connecting A-A'), the resist of the TEG is divided into a plurality of parts over the semiconductor film by spacing a distance in the first direction (a direction connecting A-A'). Then, the first conductive film and the second conductive film are etched into almost the same first shape by using the resist mask. In this step, the first conductive films and the second conductive films of the TFT and the semiconductor element (TEG) are formed to have different shapes. The first conductive film and the second conductive film of the TEG are divided into a plurality of parts over the semiconductor film in a first direction (a direction connecting A-A'). On the other hand, the first conductive film and the second conductive film of the TFT are not divided over the semiconductor film in the first direction (a direction connecting A-A'). At the etching of the second conductive film, as an etching gas, a mixed gas of Cl$_2$, SF$_6$, and O$_2$ is used, and the mixture ratio is Cl$_2$/SF$_6$/O$_2$=33/33/10 sccm. Plasma is generated by supplying a power of 2000 W to a coil-shaped electrode at a pressure of 0.67 Pa. Power of 50 W is applied to a substrate side (sample stage). At the etching of the first conductive film, plasma is generated by supplying a power of 2000 W to a coil-shaped electrode at a pressure of 0.67 Pa. Power of 50 W is applied to the substrate side (sample stage). An etching gas is Cl$_2$.

Next, plasma is generated by supplying a power of 2000 W to a coil-shaped electrode at a pressure of 1.33 Pa. No power is applied to the substrate side (sample stage). As an etching gas, a mixed gas of $Cl_2$, $SF_6$, and $O_2$ is used, and the mixture ratio is $Cl_2/SF_6/O_2$=22/22/30 sccm. At this etching, the resist mask is recessed to have a narrow mask width. As the resist mask that recesses at the same time, the gate length of the second conductive film is recessed in the same manner to perform etching into a second shape. At this time, the first conductive film is not etched and almost remains in the first shape.

Through the above steps, an electrode shape that the gate length of the lower layer is longer than that of the upper layer is obtained as shown in FIGS. 14A to 14E. The electrode shape of this embodiment mode is formed by utilizing a resist recess width during etching. In this step, a TEG has an electrode including the first and second conductive films divided into a plurality of parts, and an electrode 117 is formed by spacing a distance a based on the second conductive film.

In the manufacturing method of the electrode 117 having a shape that the gate length of the lower layer is longer than that of the upper layer, the electrode 117 includes a first conductive film 511 in the lower layer and a second conductive film 512 in the upper layer, and the difference between the gate length of the first conductive film 511 and that of the second conductive film 512 (Lov length) can be 20 to 200 nm; thus, it is possible to form an extremely fine electrode structure.

The etchings of this embodiment mode can be performed by dry etching, and specifically, an ICP (Inductively Coupled Plasma) etching method can be used.

Next, an island-shaped semiconductor film 113 is doped with a low-concentration impurity ion. The island-shaped semiconductor film 113 is doped with a low-concentration impurity element by transmitting the first conductive film 511 and the first insulating film to form a low-concentration impurity region 509 in the island-shaped semiconductor film portion overlapped with the first conductive film. In addition, at the same time, the both end portions of the island-shaped semiconductor film are doped with the impurity element by transmitting only the first insulating film to from the low-concentration impurity region. The element concentration of the low-concentration impurity region is $1\times10^{16}$ to $1\times10^{20}$ atoms/cm$^3$ (preferably, $1\times10^{16}$ to $5\times10^{19}$ atoms/cm$^3$). As an accelerating voltage, a voltage with which the impurity ion can transmit the first conductive film and the first insulating film is used. For example, a voltage at 50 kV to 90 kV (preferably, 60 kV to 80 kV) is used. An ion doping method or an ion implantation method can be used as the doping method. For example, boron (B), gallium (Ga), or the like is used as the impurity element in manufacturing a P-type semiconductor, whereas phosphorus (P), arsenic (As), or the like is used in manufacturing an N-type semiconductor.

Doping to the low-concentration impurity region 509 is performed through not only the first insulating film but also the first conductive film 511. Therefore, the concentration of the impurity element of the low-concentration impurity region 509 is lower than that of other low-concentration impurity region.

Then, doping of a high-concentration impurity ion is performed to the island-shaped semiconductor film 113 by using the electrode 117 including the first conductive film 511 and the second conductive film 512 as a mask to form a high-concentration impurity region 513. The element concentration of the high-concentration impurity region 513 is $1\times10^{18}$ to $1\times10^{22}$ atoms/cm$^3$ (preferably, $1\times10^{19}$ to $5\times10^{20}$ atoms/cm$^3$). As an accelerating voltage, a voltage at 10 kV to 20 kV is used so that the element concentration in the bottom of the island-shaped semiconductor film 113 is $1\times10^{17}$ to $1\times10^{20}$ atoms/cm$^3$ (preferably, $1\times10^{18}$ to $5\times10^{19}$ atoms/cm$^3$). 10 kV is used in this embodiment mode. An ion doping method or an ion implantation method can be used as the doping method. For example, boron (B), gallium (Ga), or the like is used as the impurity element in manufacturing a P-type semiconductor, whereas phosphorus (P), arsenic (As), or the like is used in manufacturing an N-type semiconductor.

Next, a second insulating film is formed so as to cover the first insulating film and the electrode 117. The second insulating film is formed by depositing a silicon oxide containing nitrogen ($SiO_xN_y$ film) (x>y) of 100 nm by a plasma CVD method and thereafter a silicon oxide ($SiO_2$ film) of 200 nm by a thermal CVD method. As the insulating film, a silicon oxide film ($SiO_xN_y$ film) may be formed from TEOS/$O_2$-based material by plasma CVD.

Then, the second insulating film is selectively etched by anisotropic etching by which etching is mainly performed in a perpendicular direction to form an insulator 120 in contact with each side face of the electrode 117 and an insulator 120 in a region between the electrodes divided into a plurality of parts. The insulator formed on each side face of the electrode can be formed to have a width b of 10 to 300 nm, based on the second conductive film. The distance a between the electrodes 117 divided into a plurality of parts may be shorter than the twice of the width b of the insulator formed on each side face of the electrode. In other words, the distance a between the electrodes divided into a plurality of parts and the width b of the insulator formed on each side face of the electrode may satisfy the relation of a<2b. Note that both the distance a and the width b is a value based on the second conductive film. A region between the electrodes divided into a plurality of parts is still covered with the insulator even after the anisotropic etching step as long as the relation of a<2b is satisfied. Thus, metal silicide will not be formed in the region between the electrodes divided into a plurality of parts in subsequent steps. The insulator 120 formed on each side face of the electrode becomes a sidewall, which will be subsequently used as a mask in forming silicide. In addition, part of the first insulating film is also removed by the etching step to form an insulating film 121, and part of the semiconductor film is exposed. The step of exposing the semiconductor film by removing the first insulating film is performed by using the electrode, the insulator in contact with each side face of the electrode, and the insulator formed in the region between the electrodes divided into a plurality of parts as masks. The portions of the exposed semiconductor film subsequently serve as source and drain regions. The insulating film 121 serves as a gate insulating film. When the etching selectivity of the insulating film and the semiconductor film is low, the exposed semiconductor film is slightly etched to have a thin film thickness.

Next, after forming a silicide layer 123, an interlayer insulating film 124 and a wiring 126 are formed to obtain the structure shown in FIGS. 14A to 14E.

Although not shown, a structure of a TFT of this embodiment mode may be formed by forming a mask 127 without forming the insulator 120 in the same manner as Embodiment Mode 1.

Through the above steps, a TFT having the low-concentration impurity region 509 is completed as a Lov region. A TFT formed in this embodiment mode has the Lov region; therefore, short channel effect to be occurring when the gate length gets shorter can be suppressed.

As described above, in a semiconductor device including a TFT manufactured in this embodiment mode, the TFT having source and drain regions where metal silicide is formed in the high-concentration impurity region, and a Lov region; and the semiconductor element where metal silicide is not formed in the impurity regions can be formed over the same substrate without increasing the number of steps.

The method for measuring the semiconductor element where metal silicide is not formed in the impurity regions that are manufactured in this embodiment mode is the same as that explained in Embodiment Mode 1; thus, the explanation is omitted here.

According to this embodiment mode, it is possible to form a semiconductor element for evaluation having a Si region where metal silicide is not formed in part of an impurity region without increasing the number of steps in a manufacturing process of a TFT where metal silicide is formed in an impurity region. Resistance of the impurity region of Si can be measured by measuring with a certain measurement condition with the use of the semiconductor element, a faulty step will be found easily, and feedback to steps will be performed easily.

Embodiment Mode 4

In this embodiment mode, a structure having a low-concentration impurity region that is disposed to overlap with an electrode with an insulating film interposing therebetween (a Lov region) and a low-concentration impurity region that is not disposed to overlap with an electrode with an insulating film interposing therebetween (a Loff region) will be explained with reference to FIGS. 15A to 15E. In addition, portions identical with Embodiment Modes 1 to 3 are denoted by the same reference numerals and detailed explanations thereof will be omitted. FIG. 15A shows a cross-sectional view of a TFT, FIGS. 15B, 15D, and 15E each show a cross-sectional view of a semiconductor element (TEG), and FIG. 15C shows a top view of the semiconductor element (TEG). FIG. 15B is a cross section taken along A-A' in FIG. 15C, FIG. 15D is a cross section taken along B-B' in FIG. 15C, and FIG. 15E is a cross section taken along C-C' in FIG. 15C. Note that FIG. 15A corresponds to a cross-sectional view taken along B-B' in a direction intersecting with A-A' in FIG. 15C.

In this embodiment mode, up to steps of forming an electrode 117 having a shape that the gate length of a lower layer is longer than that of an upper layer, a TFT and a semiconductor element are formed in the same steps as Embodiment Mode 3. Next, an island-shaped semiconductor film is doped with a low-concentration impurity ion. The island-shaped semiconductor film is doped with a low-concentration impurity element by transmitting a first conductive film 511 and a first insulating film to form a low-concentration impurity region 509 in the island-shaped semiconductor film portion overlapped with the first conductive film. In addition, at the same time, the both end portions of the island-shaped semiconductor film are doped with the impurity element by transmitting only the first insulating film to from the low-concentration impurity region. The element concentration of the low-concentration impurity region is $1\times10^{16}$ to $1\times10^{20}$ atoms/cm$^3$ (preferably, $1\times10^{16}$ to $5\times10^{19}$ atoms/cm$^3$). As an accelerating voltage, a voltage with which the impurity ion can transmit the first conductive film and the first insulating film is used. For example, a voltage at 50 kV to 90 kV (preferably, 60 kV to 80 kV) is used. An ion doping method or an ion implantation method can be used as the doping method. For example, boron (B), gallium (Ga), or the like is used as the impurity element in manufacturing a P-type semiconductor, whereas phosphorus (P), arsenic (As), or the like is used in manufacturing an N-type semiconductor.

Doping to the low-concentration impurity region 509 is performed through not only the first insulating film but also the first conductive film 511. Therefore, the concentration of the impurity element of the low-concentration impurity region 509 is lower than that of other tow-concentration impurity region.

Then, an insulator 120 in contact with each side face of the electrode 117 including the first conductive film 511 and the second conductive film 512 and an insulator 120 in a region between the electrodes divided into a plurality of parts are formed, and an insulating film 121 is newly formed by etching the first insulating film. At this time, when the etching selectivity of the insulating film and the semiconductor film is low, the semiconductor film that is not covered with the insulators 120 is slightly etched to have a thin film thickness, simultaneously with forming the semiconductor film 121.

Next, doping of a high-concentration impurity ion is performed by using the electrode 117 and the insulator 120 as masks to form a high-concentration impurity region 404. A low-concentration impurity region 405 is formed by doping of the high-concentration impurity ion. The element concentration of the high-concentration impurity region 404 is $1\times10^{19}$ to $1\times10^{21}$ atoms/cm$^3$. An ion doping method or an ion implantation method can be used as the doping method. For example, boron (B), gallium (Ga), or the like is used as the impurity element in manufacturing a P-type semiconductor, whereas phosphorus (P), arsenic (As), or the like is used in manufacturing an N-type semiconductor.

Then, after forming a silicide layer 123, an interlayer insulating film 124 and a wiring 126 are formed to obtain the structure shown in FIGS. 15A to 15E.

Although not shown, a structure of a semiconductor element of this embodiment mode may be formed by forming a mask 127 without forming the insulator 120 in the same manner as Embodiment Mode 1.

Through the above steps, a TFT having a Lov region and a Loff region is completed. A TFT formed in this embodiment mode has the Lov region and the Loff region; therefore, short channel effect to be occurring when the gate length gets shorter can be suppressed.

As described above, in a semiconductor device including a TFT manufactured in this embodiment mode, the TFT having source and drain regions where metal silicide is formed in the high-concentration impurity region, a Lov region, and a Loff region; and the semiconductor element where metal silicide is not formed in the low-concentration impurity region can be formed over the same substrate without increasing the number of steps.

The method for measuring the semiconductor element where metal silicide is not formed in the low-concentration impurity region that is manufactured in this embodiment mode is the same as that explained in Embodiment Mode 1; thus, the explanation is omitted here.

According to this embodiment mode, it is possible to form a semiconductor element for evaluation having a Si region where metal silicide is not formed in part of an impurity region without increasing the number of steps in a manufacturing process of a TFT where metal silicide is formed in an impurity region. Resistance of the impurity region of Si can be measured by measuring with a certain measurement condition with the use of the semiconductor element, a faulty step will be found easily, and feedback to steps will be performed easily.

Embodiment Mode 5

Although Embodiment Modes 1, 2, 3, and 4 each show an example of using a semiconductor element that is manufactured simultaneously with a TFT as an element for evaluation (TEG), this embodiment mode shows an example of using the semiconductor element as a resistive element of a circuit without change. A circuit using a semiconductor element where metal silicide is not formed in part of an impurity region of Si that is formed using Embodiment Mode 1, 2, 3, or 4 will be explained.

In this embodiment mode, an example of using a semiconductor element for a delay circuit will be explained; however, the present invention is not limited thereto and can be used as resistors of various circuits.

Figure 16B:
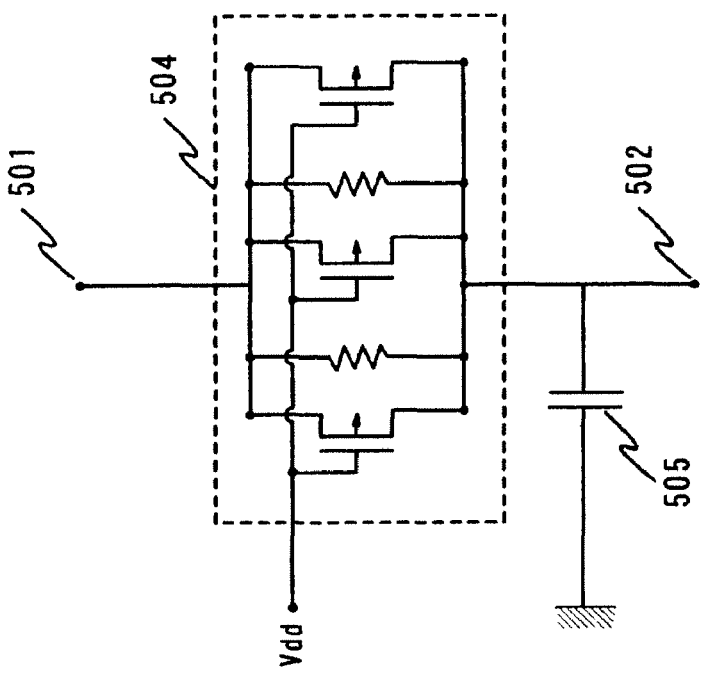
FIGS. 16A and 16B are diagrams each showing Embodiment Mode 5 according to the present invention.
Figure 16A:
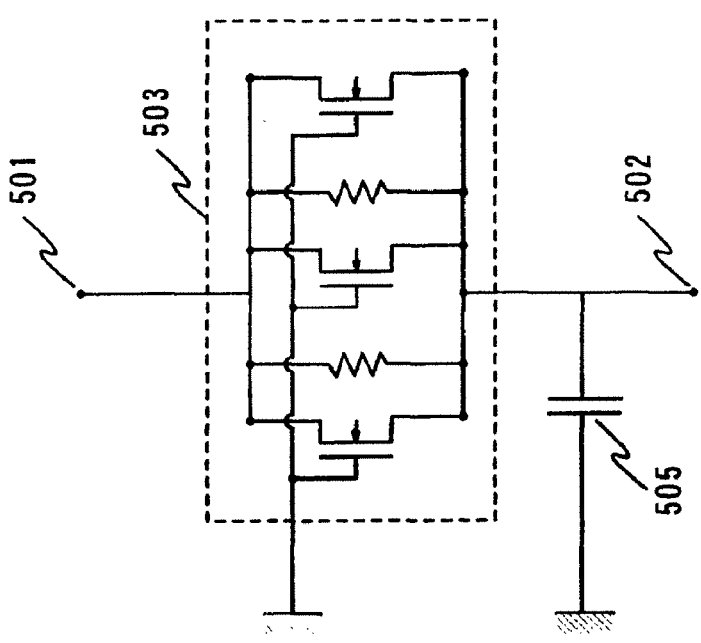

A delay circuit using a resistive element which is formed by doping an N-type impurity ion will be explained with reference to FIG. 16A. A terminal 501 is an input terminal, a terminal 502 is an output terminal, and an element 503 is a semiconductor element that is formed using Embodiment Mode 1, 2, 3, or 4, which are shown in an equivalent circuit including TFTs and resistors. Since the TFT in the element 503 is an N-type TFT, a gate electrode is connected to a ground (GND) and the TFT is made in an off state. When the TFT is in an off state, current does not flow in the TFT portion; thus, only the original resistor can have approximation substantially as an equivalent circuit. Therefore, the element 503 can be used as a resistive element by making the TFT an off state. A signal inputted from the terminal 501 is outputted from the terminal 502 through the element 503 and a capacitor 505 in FIG. 16A.

Figures 17A, 17B:
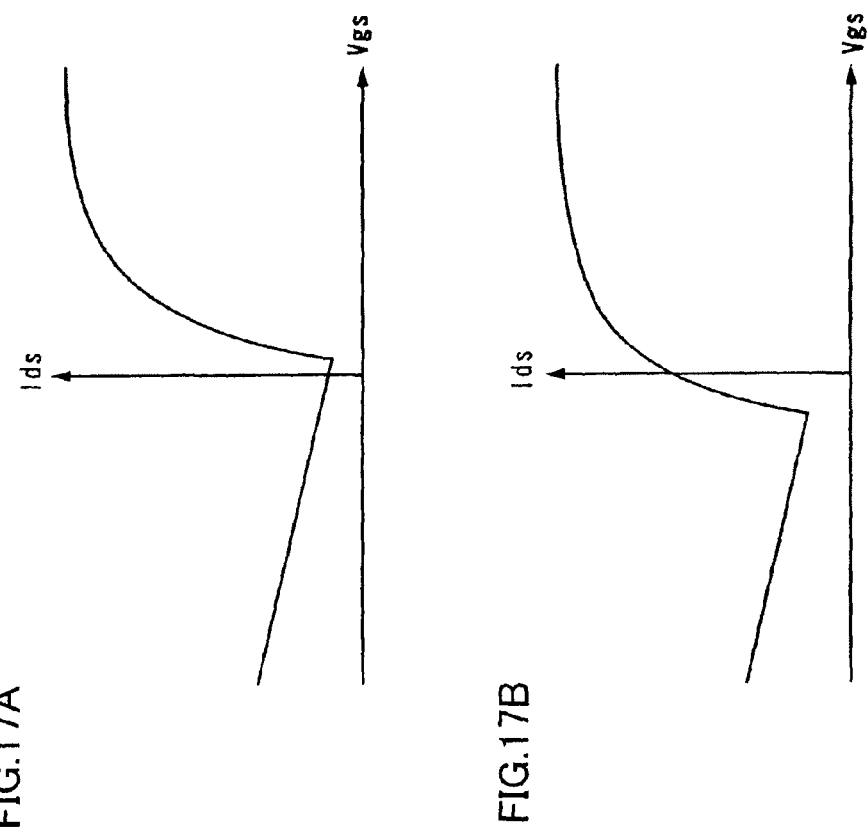
FIGS. 17A and 17B are graphs each showing Embodiment Mode 5 according to the present invention.

The signal inputted from the terminal 501 has potential of 0 or more. The TFT in the element 503 is always in an off state, even when an inputted signal is changed, as long as an N-type TFT has a structure of an enhancement-type TFT shown in FIG. 17A. In a structure of a depletion-type TFT shown in FIG. 17B, current may flow in the TFT portion even when potential of the inputted signal is almost 0. In this case, there is no problem as long as the resistance in the element 503 is high. However, the value of current that flows in the TFT portion cannot be ignored when the resistance of the element 503 is low, and whole resistance of the element 503 is changed due to the inputted signal. It is necessary to decide a depletion-type TFT or an enhancement-type TFT according to resistance in the element 503.

A delay circuit using a resistive element which is formed by doping a P-type impurity ion will be explained with reference to FIG. 16B. A terminal 501 is an input terminal, a terminal 502 is an output terminal, and an element 504 is a semiconductor element that is formed using Embodiment Mode 1, 2, 3, or 4, which are shown in an equivalent circuit including TFTs and resistors. Since the TFT in the element 504 is a P-type TFT, a gate electrode is connected to a poser supply line (Vdd) and the TFT is made in an off state. When the TFT is in an off state, current does not flow in the TFT portion; thus, only the original resistor can have approximation substantially as an equivalent circuit. Therefore, the element 504 can be used as a resistive element by making the TFT an off state. A signal inputted from the terminal 501 is outputted from the terminal 502 through the element 504 and a capacitor 505 in FIG. 16B.

Figure 18A:
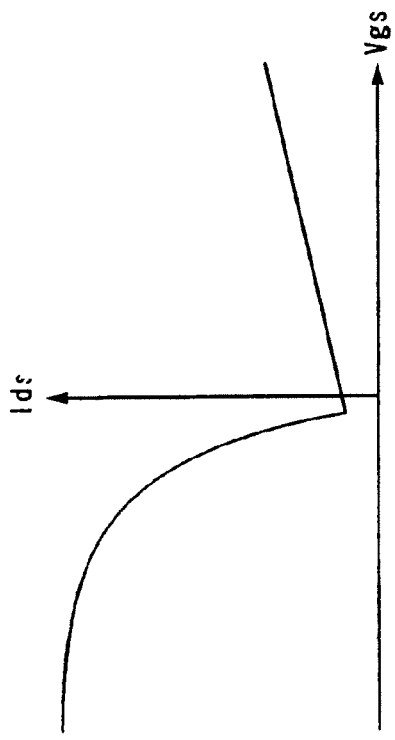
FIGS. 18A and 18B are graphs each showing Embodiment Mode 5 according to the present invention.
Figure 18B:
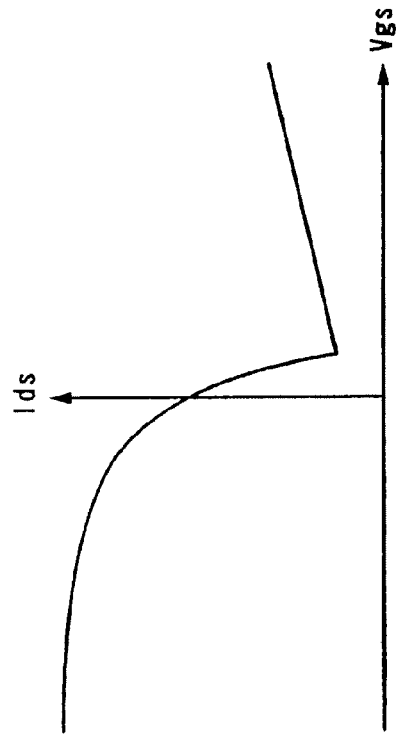

The signal inputted from the terminal 501 has potential of 0 or more. The TFT in the element 504 is always in an off state, even when an inputted signal is changed, as long as a P-type TFT has a structure of an enhancement-type TFT shown in FIG. 18A. In a structure of a depletion-type TFT shown in FIG. 18B, current may flow in the TFT portion even when potential of the inputted signal is almost 0. In this case, there is no problem as long as the resistance in the element 504 is high. However, the value of current that flows in the TFT portion cannot be ignored when the resistance of the element 504 is low, and whole resistance of the element 504 is changed due to the inputted signal. It is necessary to decide a depletion-type TFT or an enhancement-type TFT according to resistance in the element 504.

According to the present invention, metal silicide is formed in an impurity region, whereas a Si region where metal silicide is not formed in part of the impurity region can be manufactured without increasing the number of steps. In addition, it is possible to manufacture a resistive element in which the impurity region of Si where metal silicide is not formed is used as a resistor. Therefore, a circuit area can be reduced by using the resistive element as a resistor of a circuit.

The circuit area can be reduced when the electrode divided into a plurality of parts is formed so as to have a width W of the channel width direction narrow as much as possible.

Although, in the element 503, a resistive element in which three TFTs and two resistors are connected in parallel is shown, the number of TFTs and resistors is not limited thereto. The number of TFTs and resistors can be increased or reduced, if necessary.

Embodiment Mode 6

An another example of using, as a resistive element of a circuit, a semiconductor element where metal silicide is not formed in part of an impurity region of Si that is formed using Embodiment Mode 1, 2, 3, or 4 will be explained. In this embodiment mode, a low-pass filter circuit will be explained; however, the present invention is not limited thereto and this embodiment mode can be used as variable resistors of various circuits such as a high-pass filter circuit.

Figure 19B:
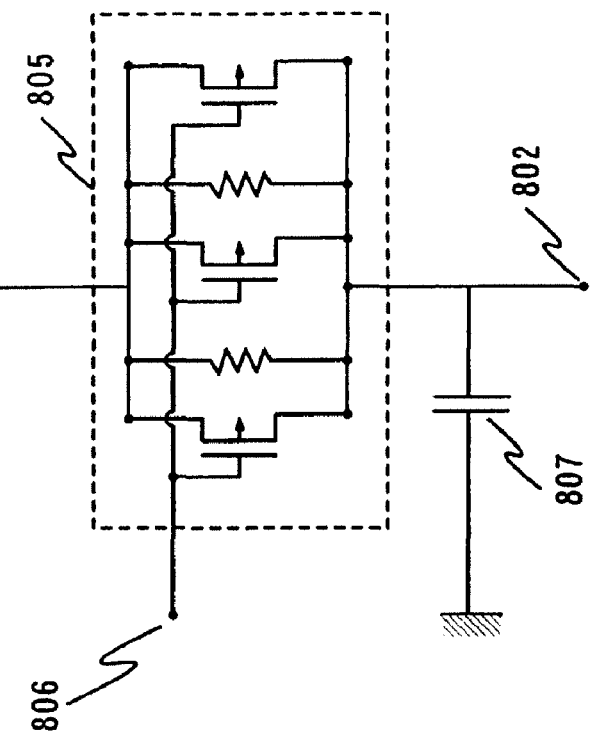
FIGS. 19A and 19B are diagrams each showing Embodiment Mode 6 according to the present invention.

A low-pass filter circuit using a resistive element which is formed by doping an N-type impurity ion will be explained with reference to FIG. 19A. A terminal 801 is an input terminal, a terminal 802 is an output terminal, and an element 803 is a variable resistive element. A terminal 804 is a control terminal to control the resistance of the element 803. Although the explanation will be omitted, it is also possible to form a low-pass filter including a terminal 806 and a terminal 805 in FIG. 19B by doping a P-type impurity ion in the same manner.

Figure 19A:
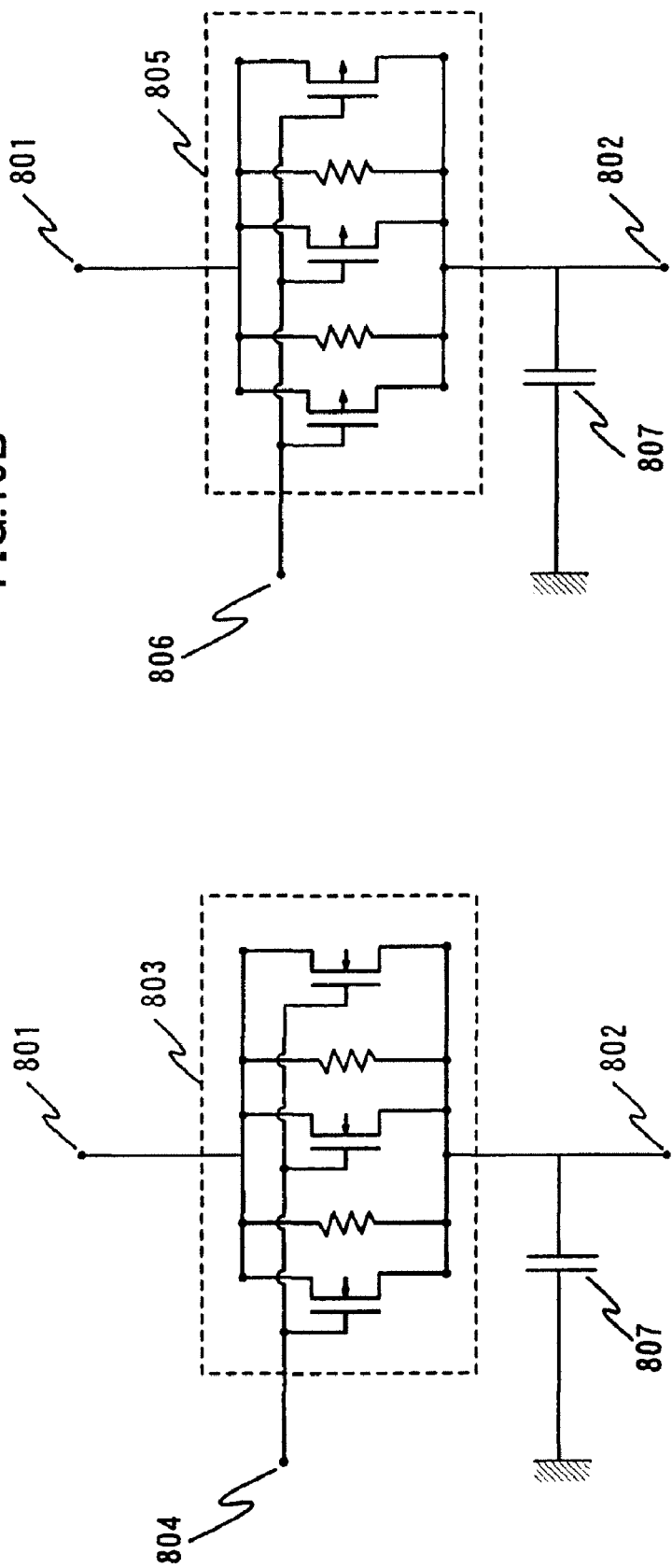

A signal inputted from the terminal 801 is outputted from the terminal 802 through the variable resistive element 803 and a capacitor 807 in FIG. 19A. At this time, a signal with a low frequency of a certain value or less depending on resistance and capacitance of the variable resistive element 803 is outputted to the terminal 802. As a TFT in the variable resistive element 803, a structure of an enhancement-type TFT or a depletion-type TFT shown in FIG. 19B can be used.

The terminal 804 is a control terminal of the variable resistive element 803, which is possible to change a voltage from a ground (GND) to a power supply voltage (Vdd).

The variable resistive element 803 is formed of a resistor including a low-concentration impurity region or a high-concentration impurity region, and a TFT. However, the resistance can be changed within an arbitrary range by adjusting the value of the resistance of the resistor including a low-concentration impurity region or a high-concentration impurity region, and current flowing in a TFT. In addition, it is also possible to change the resistance of the resistor including a low-concentration impurity region or a high-concentration impurity region within an extremely narrow range. By utilizing the change in resistance, it is possible to control a threshold value frequency of a pass-filter circuit.

In this embodiment mode, the control of a threshold frequency of a pass-filter circuit using a variable resistive element is explained; however, the variable resistive element that is shown in this embodiment mode can be used for various circuits such as a delay circuit to control delay time.

According to the present invention, metal silicide is formed in an impurity region, whereas a Si region where metal silicide is not formed in part of the impurity region can be manufactured without increasing the number of steps. In addition, it is possible to manufacture a resistive element in which the impurity region of Si where metal silicide is not formed is used as a resistor. Therefore, a circuit area can be reduced by using the resistive element as a resistor of a circuit.

The circuit area can be reduced when the electrode divided into a plurality of parts is formed so as to have a width W of the channel width direction narrow as much as possible.

Although, in the element 803, a resistive element in which three TFTs and two resistors are connected in parallel is shown, the number of TFTs and resistors is not limited thereto. The number of TFTs and resistors can be increased or reduced, if necessary.

Embodiment Mode 7

A semiconductor device shown in Embodiment Mode 1, 2, 3, 4, 5, or 6 can be used in manufacturing various electronic devices. As examples of such an electronic device, the following can be given: a television device, a camera such as a digital camera or a digital video camera, a navigation system, an audio reproducing device (a car audio, an audio component and the like), a personal computer, a game machine, a portable information terminal (a mobile computer, a cellular phone, a portable game machine, an electronic book, and the like), an image reproducing device provided with a recording medium (specifically a device capable of reproducing the content of a recording medium such as a Digital Versatile Disc (DVD) and that has a display device capable of displaying the image), and the like.

According to the present invention, it is possible to improve an integration degree of a circuit. In addition, the product of a manufactured semiconductor device has preferable quality. The specific examples will be explained with reference to FIGS. 20A to 20E.

Figure 20A:
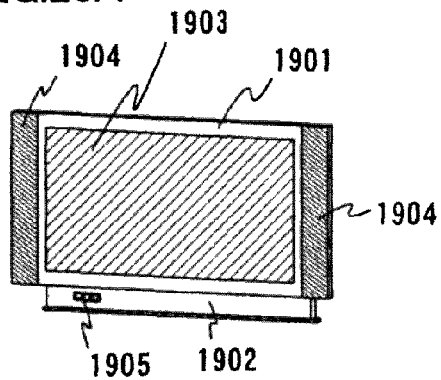
FIGS. 20A to 20E are views each showing Embodiment Mode 7 according to the present invention.

FIG. 20A is a display device, which includes a housing 1901, a supporting stand 1902, a display portion 1903, a speaker portion 1904, a video input terminal 1905, and the like. The display device is manufactured by using a thin film transistor, a semiconductor element, or a circuit that is formed by the manufacturing method shown in Embodiment Modes 1 to 6 for the display portion 1903 and a driver circuit. Note that the display device indicates a liquid crystal display device, a light-emitting device, or the like, which includes all display devices for information display such as the ones for a computer, TV broadcast reception, and advertisement display.

Figure 20B:
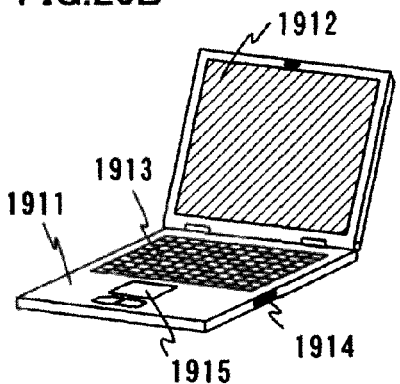

FIG. 20B is a computer, which includes a housing 1911, a display portion 1912, a keyboard 1913, an external connection port 1914, a pointing mouse 191S, and the like. By using the manufacturing method shown in Embodiment Modes 1 to 6, the present invention can be applied to the display portion 1912 or other circuit. Further, the present invention can also be applied to a semiconductor device such as a CPU or a memory inside the main body.

Figure 20C:
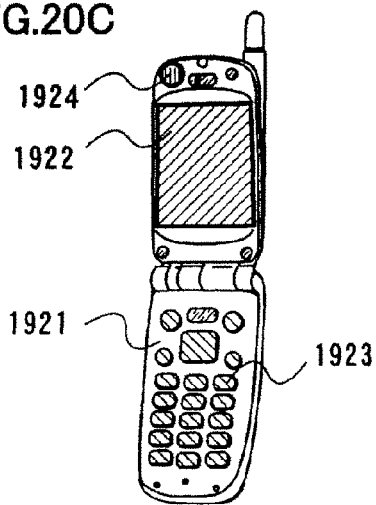

In addition, FIG. 20C is a cellular phone, which is a typical example of a portable information terminal. The cellular phone includes a housing 1921, a display portion 1922, a sensor portion 1924, operation keys 1923, and the like. The sensor portion 1924 has a light sensor element, and the amount of consumption current of the cellular phone can be suppressed by controlling the brightness of the display portion 1922 based on the illumination intensity obtained by the sensor portion 1924, performing the lighting control of the operation keys 1923 corresponding to the illumination intensity obtained by the sensor portion 1924. In addition, in a case of a cellular phone having an imaging function such as a CCD, whether a person who takes a picture looks in an optical finder or not is detected as the amount of light received by a sensor of the sensor portion 1924 provided in the vicinity of the optical finder changes. In a case where a person who takes a picture looks in the optical finder, the amount of power consumption can be suppressed by making off the display portion 1922.

The display screen of electronic devices such as the above cellular phone, a PDA (Personal Digital Assistants), a digital camera, a compact game machine, or the like, is small, because these electronic devices are each a mobile information terminal. Therefore, by forming functional circuits such a CPU, a memory, a sensor with using a minute transistor shown in the above embodiment mode, electronic devices can be smaller and lighter.

In addition, a TFT or a semiconductor element of the present invention can be used as a thin film integrated circuit or a non-contact thin film integrated circuit device (also, referred to as Radio Frequency IC tag, RFID (Radio Frequency Identification)). Moreover, such as a distribution route of the electronic devices can be revealed by attaching an IC tag to various electronic devices.

Figure 20D:
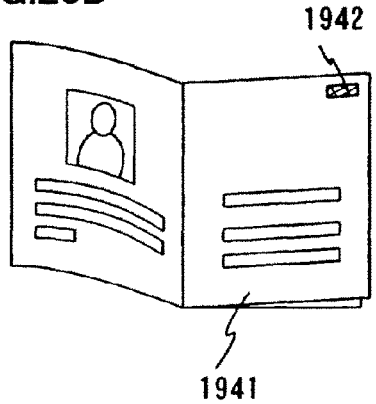

FIG. 20D shows a state in which a radio frequency IC tag 1942 is attached to a passport 1941. The passport 1941 may be embedded in the radio frequency IC tag. In the same manner, the radio frequency IC tag can be attached to or embedded in a driver's license, a credit card, cash, coin, securities, a gift certificate, a ticket, a traveler's check (T/C), insurance, a residence certificate, a family register, or the like. In this case, only the information showing the real one is inputted into the radio frequency IC tag and an access right is set to prevent illegal reading or writing of information. This can be realized by using a TFT or a memory shown in Embodiment Modes 1 to 6. By using it as a tag, in this manner, it is possible to distinguish a counterfeit from the real one.

Figure 20E:
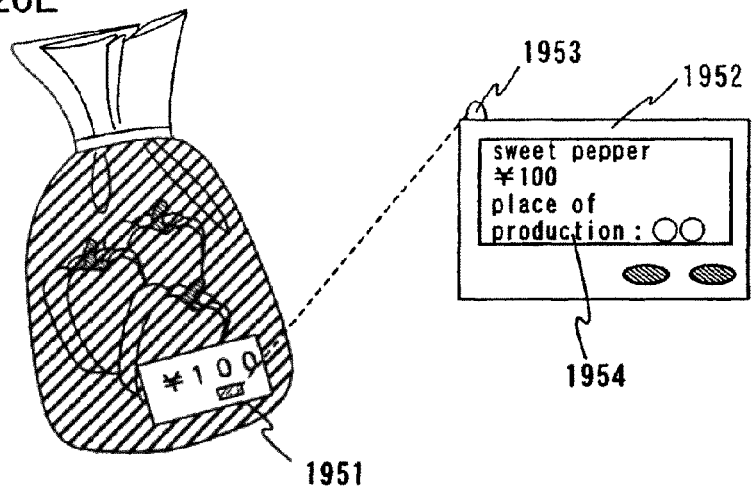

In addition to the above, the radio frequency IC tag can also be used as a memory. FIG. 20E shows an example in which the radio frequency IC tag 1951 is attached to a label attached to a vegetable wrapping. Moreover, the radio frequency IC tag may be attached to or embedded in the wrapping itself. The radio frequency IC tag 1951 can record process of commodity circulation, price, numerical quantity, use application, shape, weight, expire date, various identification information, etc, and stages of a production process such as place of production, producer, date of manufacture, processing method, etc. The information from the radio frequency IC tag 1951 is read by receiving it with an antenna portion 1953 of a wireless reader 1952, and displaying on a display portion 1954 of the reader 1952. Thus, the information can be easily known by a dealer, a retail seller, and a consumer. In addition, by providing the access right to each producer, trader, and consumer, it is set so that a person who does not have an access right cannot read, write, change, or erase information.

Further, the radio frequency IC tag can be used as below. In stores, the information that payment has been made is written in the radio frequency IC tag, and whether payment has been made or not is checked at a provided checking device at an entrance. If people leave the stores without payment, an alarm rings. By this method, forgetting payment or shoplifting can be prevented.

Further, in considering the privacy protection of customers, the following methods are possible. Either of the methods is employed when the payment is made: (1) the data inputted in the radio frequency IC tag is locked with a code number or the like; (2) the data itself inputted in the radio frequency IC tag is encrypted; (3) the data inputted in the radio frequency IC tag is erased; or (4) the data inputted in the radio frequency IC tag is destroyed. These methods can be realized by using a memory shown in the above embodiment modes. A checking device is provided at an entrance, and whether or not either of the processes (1) to (4) is conducted or whether nothing is written in the data in the radio frequency IC tag is checked, in order to check whether payment has been made. In this manner, it is possible to check whether payment has been made in stores, and it can prevent the information in the radio frequency IC tag to be read without the holder's intention outside of stores.

The manufacturing cost of the above radio frequency IC tag is higher than that of a barcode used conventionally. Thus, it is necessary to reduce the cost. According to the present invention, a faulty step will be found easily and feedback to steps will be performed easily so that it is effective for cost reduction. Further, it is possible to manufacture all radio frequency IC tags with high quality and without variations of its function.

As mentioned above, the applicable range of a semiconductor device manufactured by the present invention is extremely wide, and a semiconductor device manufactured according to the present invention can be used for various electronic devices.

What is claimed is:

1. A semiconductor device comprising:
   a first insulating film over a substrate;
   an island-shaped semiconductor film having an impurity region over the first insulating film, the impurity region comprising:
      a first region over the first insulating film; and
      a second region over the first region;
   a second insulating film, which is over the island-shaped semiconductor film, formed so as to expose a portion of the impurity region;
   a first electrode and a second electrode separated in a direction over the second insulating film, wherein the first electrode and the second electrode overlap the island-shaped semiconductor film so that a first channel formation region and a second channel formation region are formed in the impurity region, and wherein the first electrode and the second electrode are aligned along a channel width direction of the first channel formation region;
   a first insulator on a first side face of each of the first electrode and the second electrode, and a second insulator in a region between a second side face of the first electrode and a second side face of the second electrode, and
   a resistive element formed in the impurity region between the first channel formation region and the second channel formation region,
   wherein a metal silicide is formed in the second region.

2. A semiconductor device according to claim 1, wherein the semiconductor device includes an element for evaluation having the first electrode and the second electrode.

3. A semiconductor device according to claim 1, wherein the resistive element comprises the first electrode and the second electrode.

4. A semiconductor device according to claim 1, wherein the impurity region is formed by adding an impurity element by using the first electrode and the second electrode as masks.

5. A semiconductor device according to claim 1,
   wherein the first electrode and the second electrode are separated by a distance "a",
   wherein the first insulator has a width "b", and
   wherein the distance "a" between the first electrode and the second electrode and the width "b" of the first insulator satisfy a relation of a<2b.

6. A semiconductor device according to claim 1, wherein the first insulator is a sidewall.

7. A semiconductor device according to claim 1, wherein the metal silicide includes an element selected from the group consisting of nickel, titanium, cobalt, and platinum.

8. The semiconductor device according to claim 1 is a test element group.

9. The semiconductor device according to claim 1, wherein a metal silicide is not formed in the first region.

10. A semiconductor device comprising:
    a first insulating film over a substrate;
    an island-shaped semiconductor film having an impurity region over the first insulating film, the impurity region comprising:
       a first region over the first insulating film; and
       a second region over the first region;
    a second insulating film, which is over the island-shaped semiconductor film, formed so as to expose a portion of the impurity region;
    a first electrode and a second electrode separated in a direction over the second insulating film, wherein the first electrode and the second electrode overlap the island-shaped semiconductor film so that a first channel formation region and a second channel formation region are formed in the impurity region, and wherein the first electrode and the second electrode are aligned along a channel width direction of the first channel formation region;
    a first insulator on a first side face of each of the first electrode and the second electrode, and a second insulator in a region between a second side face of the first electrode and a second side face of the second electrode;
    a resistive element formed in the impurity region between the first channel formation region and the second channel formation region;
    an interlayer insulating film over the second region, the first electrode and the second electrode; and
    a conductive layer which is in contact with the second region through a contact hole in the interlayer insulating film
    wherein a metal silicide is formed in the second region.

11. A semiconductor device according to claim 10, wherein the semiconductor device includes an element for evaluation having the first electrode and the second electrode.

12. A semiconductor device according to claim 10, wherein the resistive element comprises the first electrode and the second electrode.

13. A semiconductor device according to claim 10, wherein the impurity region is formed by adding an impurity element by using the first electrode and the second electrode as masks.

14. A semiconductor device according to claim 10,
    wherein the first electrode and the second electrode are separated by a distance "a",
    wherein the first insulator has a width "b", and
    wherein the distance "a" between the first electrode and the second electrode and the width "b" of the first insulator satisfy a relation of a<2b.

15. A semiconductor device according to claim 10, wherein the first insulator is a sidewall.

16. A semiconductor device according to claim 10, wherein the metal silicide includes an element selected from the group consisting of nickel, titanium, cobalt, and platinum.

17. The semiconductor device according to claim 10 is a test element group.

18. The semiconductor device according to claim 10, wherein a metal silicide is not formed in the first region.

* * * * *